US005206446A

United States Patent [19]

Matsumoto et al.

[11] Patent Number: 5,206,446

[45] Date of Patent: Apr. 27, 1993

[54] ELECTRONIC MUSICAL INSTRUMENT HAVING A PLURALITY OF TONE GENERATION MODES

[75] Inventors: Naoaki Matsumoto, Akishima; Hitoshi Ando, Hachioji; Jun Yoshino; Hitoshi Kato, both of Fussa, all of Japan

[73] Assignee: Casio Computer Co., Ltd., Tokyo, Japan

[21] Appl. No.: 465,039

[22] Filed: Jan. 16, 1990

[30] Foreign Application Priority Data

Jan. 18, 1989 [JP] Japan .......... 1-9434
Jan. 18, 1989 [JP] Japan .......... 1-9435
Jan. 19, 1989 [JP] Japan .......... 1-10388

[51] Int. Cl.[5] .......... H03C 1/00

[52] U.S. Cl. .......... 84/624; 84/645; 84/615; 84/653

[58] Field of Search .......... 84/600–603, 84/609, 615, 622, 624–626, 645, 647, 649, 653, 659, 660, 662, 629

[56] References Cited

U.S. PATENT DOCUMENTS 4,253,367 3/1981 Hiyoshi et al. .......... 84/624
4,450,745 5/1984 Nakada et al. .......... 84/622
4,590,838 5/1986 Kashio .
4,788,896 12/1988 Uchiyama et al. .......... 84/624
4,817,484 4/1989 Iba et al. .
4,841,827 6/1989 Uchiyama .
4,915,007 4/1990 Wachi et al. .......... 84/622
4,984,495 1/1991 Fujimori .......... 84/603
4,984,497 1/1991 Inagaki et al. .......... 84/602 X
4,998,960 3/1991 Rose et al. .......... 84/622
5,007,323 4/1991 Usami .......... 84/607
5,025,702 6/1991 Oya .......... 84/659
5,081,898 1/1992 Fujimori .......... 84/615 X

FOREIGN PATENT DOCUMENTS 0206786 12/1986 European Pat. Off. .
0281214 7/1988 European Pat. Off. .

*Primary Examiner*—William M. Shoop, Jr.
*Assistant Examiner*—Jeffrey W. Donels
*Attorney, Agent, or Firm*—Frishauf, Holtz, Goodman & Woodward

[57] ABSTRACT

An electronic musical instrument has a tone generation mode selecting switch capable of selecting a tone generation mode associated with an arbitrary one of a keyboard instrument play mode, a stringed instrument play mode and a wind instrument play mode, and a CPU for controlling the tone generation mode for a tone generator in accordance with the selection. This electronic musical instrument serving as a so-called tone generator module, can be driven by a MIDI signal supplied to a MIDI circuit from an external unit.

7 Claims, 22 Drawing Sheets

| | NORMAL | | | COMBINATION | | | MULTI. |
|---|---|---|---|---|---|---|---|
| | KEYBOARD MODE | GUITAR MODE | WIND MODE | KEYBOARD MODE | GUITAR MODE | WIND MODE | KEYBOARD MODE |
| NOTE ON/OFF | ONE FIXED CHANNEL | INDEPENDENT FROM ONE FIXED CHANNEL TO +5 CHANNELS | ONE FIXED CHANNEL | ONE FIXED CHANNEL | INDEPENDENT FROM ONE FIXED CHANNEL TO +5 CHANNELS | ONE FIXED CHANNEL | INDEPENDENT FOR INDIVIDUAL CHANNELS |
| PITCH BENDER | ONE FIXED CHANNEL | INDEPENDENT FROM ONE FIXED CHANNEL TO +5 CHANNELS | ONE FIXED CHANNEL | ONE FIXED CHANNEL | INDEPENDENT FROM ONE FIXED CHANNEL TO +5 CHANNELS | ONE FIXED CHANNEL | INDEPENDENT FOR INDIVIDUAL CHANNELS |
| AFTER TOUCH | ONE FIXED CHANNEL AFTER CURVE OF KEYBOARD | ONE FIXED CHANNEL AFTER CURVE OF KEYBOARD | ONE FIXED CHANNEL AFTER CURVE OF WIND | ONE FIXED CHANNEL AFTER CURVE OF KEYBOARD | ONE FIXED CHANNEL AFTER CURVE OF KEYBOARD | ONE FIXED CHANNEL AFTER CURVE OF WIND | INDEPENDENT FOR INDIVIDUAL CHANNELS AFTER CURVE OF KEYBOARD |
| TIMBRE CHANGE AND CONTROL CHANGE | ONE FIXED CHANNEL | ONE FIXED CHANNEL | ONE FIXED CHANNEL | ONE FIXED CHANNEL | ONE FIXED CHANNEL | ONE FIXED CHANNEL | INDEPENDENT FOR INDIVIDUAL CHANNELS |
| TIMBRE | 1 TIMBRE | 1 TIMBRE | 1 TIMBRE | 2 TIMBRES | 2 TIMBRES | 2 TIMBRES | INDEPENDENT FOR INDIVIDUAL CHANNELS |

| | NORMAL | | | COMBINATION | | | MULTI. |
|---|---|---|---|---|---|---|---|
| | KEYBOARD MODE | GUITAR MODE | WIND MODE | KEYBOARD MODE | GUITAR MODE | WIND MODE | KEYBOARD MODE |
| NOTE ON/OFF | ONE FIXED CHANNEL | INDEPENDENT FROM ONE FIXED CHANNEL TO +5 CHANNELS | ONE FIXED CHANNEL | ONE FIXED CHANNEL | INDEPENDENT FROM ONE FIXED CHANNEL TO +5 CHANNELS | ONE FIXED CHANNEL | INDEPENDENT FOR INDIVIDUAL CHANNELS |
| PITCH BENDER | ONE FIXED CHANNEL | INDEPENDENT FROM ONE FIXED CHANNEL TO +5 CHANNELS | ONE FIXED CHANNEL | ONE FIXED CHANNEL | INDEPENDENT FROM ONE FIXED CHANNEL TO +5 CHANNELS | ONE FIXED CHANNEL | INDEPENDENT FOR INDIVIDUAL CHANNELS |
| AFTER TOUCH | ONE FIXED CHANNEL AFTER CURVE OF KEYBOARD | ONE FIXED CHANNEL AFTER CURVE OF KEYBOARD | ONE FIXED CHANNEL AFTER CURVE OF WIND | ONE FIXED CHANNEL AFTER CURVE OF KEYBOARD | ONE FIXED CHANNEL AFTER CURVE OF KEYBOARD | ONE FIXED CHANNEL AFTER CURVE OF WIND | INDEPENDENT FOR INDIVIDUAL CHANNELS AFTER CURVE OF KEYBOARD |
| TIMBRE CHANGE AND CONTROL CHANGE | ONE FIXED CHANNEL | ONE FIXED CHANNEL | ONE FIXED CHANNEL | ONE FIXED CHANNEL | ONE FIXED CHANNEL | ONE FIXED CHANNEL | INDEPENDENT FOR INDIVIDUAL CHANNELS |
| TIMBRE | 1 TIMBRE | 1 TIMBRE | 1 TIMBRE | 2 TIMBRES | 2 TIMBRES | 2 TIMBRES | INDEPENDENT FOR INDIVIDU-AL CHANNELS |

FIG. 6

FIG. 8A
FIG. 8B
FIG. 8C
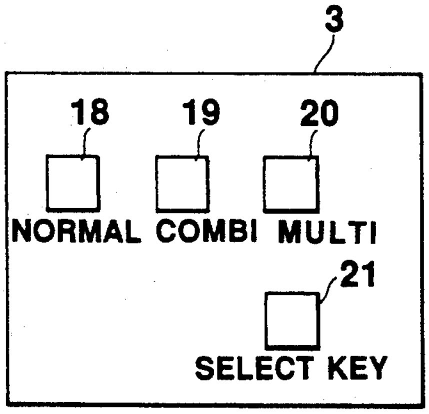
FIG. 7
FIG. 8D
FIG. 8E
FIG. 8F
FIG. 8G

ELECTRONIC MUSICAL INSTRUMENT HAVING A PLURALITY OF TONE GENERATION MODES

BACKGROUND OF THE INVENTION

1. Field of the Invention

The present invention relates to an electronic musical instrument for generating musical tones in accordance with various tone generation modes, and, more particularly, to an electronic musical instrument, such as an electronic keyboard, an electronic guitar or an electronic wind instrument, which generates musical tones in accordance with playing operation modes, or an electronic musical instrument having a tone generation mode in which a plurality of musical tones with a plurality of timbres are simultaneously generated in response to a note ON start command and other tone generation modes can be switched to one from another.

2. Description of the Related Art

Recently, various electronic musical instruments such as electronic keyboards, electronic guitars and electronic wind instruments have been developed.

When a player arbitrarily depresses one of a plurality of keys on a keyboard of an electronic keyboard, the electronic keyboard electronically detects and processes key-depressing data and key-depressing speed of each key as note ON/OFF data and initial touch data to generate a musical tone with arbitrary pitch, volume and timbre, and electrically detects and processes the pressure after the key depression as after touch data to arbitrarily alter the volume, timbre and the like of the musical tone. Further, the electronic keyboard electrically detects and processes operation data of a pitch bend wheel provided on the keyboard body to impart the same pitch bend effect to whole musical tones being generated and electronically detects and processes operation data of a modulation wheel, portamento pedal, volume pedal, etc. as control change data to impart multifarious effects to the musical tones.

When a player performs picking of an arbitrary one of, for example, six strings stretched on the body of an electronic guitar while depressing an arbitrary position on frets provided also on the guitar body, this guitar electronically detects and processes depressing data of the fret and vibration data of each string to ensure generation of a musical tone with an arbitrary pitch, volume and timbre in association with each string. In this case, when a choking operation or manipulation of a tremolo arm is executed, the guitar electrically detects and processes a change in pitch for each string as pitch bend data to impart a pitch bend effect for each string.

When a player blows through a mouth section called mouth piece while manipulating play switches for designating the desired pitch, an electronic wind instrument electronically detects and processes data from the switches as note ON/OFF data to generate a musical tone according to the switch operation, or electrically detects and processes the strength of the player's blowing through the mouth piece as after touch data to generate a musical tone with a volume and timbre according to the blowing strength.

Digital interfaces, such as MIDI (Musical Instrument Digital Interface), which facilitate connection between electronic musical instruments, are standardized so as to ensure control of a tone generator of one electronic musical instrument based on the musical operation of another electronic musical instrument, or ensure construct a music system having a plurality of electronic musical instruments by separating a tone generating section (hereinafter called a tone generator module) of an electronic musical instrument from the music operating section such as the keyboard, string and fret portion, mouth piece, or play switches, of this electronic musical instrument and connecting the tone generator module to these music operating sections via a MIDI or the like. Further, a music may be automatically played by replacing the music operating section with a sequencer or a computer and automatically outputting music play data to the tone generator module.

Recently developed electronic musical instruments, particularly, tone generator modules include a multichannel mode tone generator module which can perform different tone generations in accordance with the tone generation modes of an ordinary electronic keyboard and can have a plurality of MIDI channels set therein, so that it can function as if independent tone generators are coupled to the respective MIDI channels. The use of such a tone generator module permits a sequencer or the like to be coupled to the tone generator module and permits different music play data to be independently output for the respective MIDI channels, so that a plurality of musical tones can be independently generated by a single tone generator module.

According to the aforementioned various electronic musical instruments, formats for transferring main music play data such as note ON/OFF, pitch bend, after touch, control change or timbre change, are often unified by the MIDI standards or the like so that musical instruments of not totally different types (e.g., different types of keyboards) can be mutually connected.

In a case where based on the musical operation of, for example, an electronic guitar or an electronic wind instrument, the tone generator or tone generator module of another electronic musical instruments is controlled. However, exclusive tone generators or tone generator modules are respectively required for the target electronic musical instruments. For instance, with the use of an electronic keyboard, when music play data is output based on the MIDI standards, note ON/OFF data and pitch bend data or the like are generally output in a specific MIDI channel set in advance by a player, thus requiring a tone generator module which receives music play data and generates a musical tone according to the setting. In contrast, according to an electronic guitar, the note ON/OFF data or pitch bend data for the individual strings is output in association with one MIDI channel to a plurality of consecutive different MIDI channels and musical tones for the individual strings are independently generated from the tone generator without inconsistency in the different MIDI channels. The use of the electronic guitar, therefore, requires a tone generator module which can cope with such a tone generation mode. An electronic wind instrument specifically converts after touch data on the tone generator side to control the volume of a musical tone, for example, thus requiring a tone generator module which is specifically designed for such a tone generation mode.

As described above, the conventional electronic musical instruments can only perform a particular operation for each specific tone generation mode corresponding to a musical operation mode, so that even when different types of electronic musical instruments, such as an electronic keyboard, an electronic guitar and an electronic wind instrument, which have different tone generation modes corresponding to a plurality of musical operation modes are mutually connected, it is not possible to perform the optimal tone control. When one tone generator module is to be driven, therefore, it should be connected to the music system in a manner associated with the intended tone generation mode. This restriction requires a plurality of tone generator modules for different tone generation modes.

If the outputs of the individual strings of an electronic guitar are associated with the individual MIDI channels of the aforementioned tone generator module having a multi-channel mode and musical tones are to be generated in different MIDI channels for the respective strings, musical tones may be independently generated for the individual strings and a pitch bend effect or the like may be independently imparted for each MIDI channel or each string. In a case where each MIDI channel is used in a monophonic mode (corresponding to the mono mode with omni off in the MIDI standards), for example, if one string is consecutively picked, it is not possible to perform such a control as to permit tone off with some reverberation given to the current tone so that the next musical tone can smoothly follow the current one. If each MIDI channel is designed to be polyphonic to cope with two or more tones and an electronic guitar is designed to automatically output note ON/OFF data, the required polyphonic number of the tone generator becomes doubled or greater. For instance, 12 polyphonic sounds are required for six strings, thus preventing the effective use of the tone generator. In general, many tone generator modules have a limited number of polyphonic sounds, e.g., 8 sounds, in view of cost reduction, and such tone generator modules can hardly realize the above-described operation.

Recently, in order to improve the musical expressions given by electronic musical instruments, it becomes popular to develop those electronic musical instruments which have a play mode called a combination mode in which a plurality of musical tones are simultaneously generated for a single note ON command, such as mixing of two tones, four tones, etc., or different timbres can be set by a certain key code, such as the key split.

Let us now consider a case where a musical effect such as an LFO (Low Frequency Oscillator) vibrato or LFO tremolo (growl) is imparted to a musical tone to be generated, and particularly in a case where i.e., a delay characteristic is imparted to the musical tone. According to these LFO effects, the characteristic of a musical tone, such as the pitch, volume or timbre, periodically oscillates around the pitch, volume or timbre attained at the note ON time in accordance with a low frequency waveform (LFO waveform). Particularly, the delayed LFO effect permits the individual characteristics to have a small oscillation amplitude immediate after the note ON, increase to a given amplitude level upon elapse of a predetermined delay time, and periodically change at the given amplitude thereafter.

Conventionally, recently popular electronic keyboards or the like are designed in such a way that as the number of polyphonic sounds increases to four, eight, sixteen and so forth, the LFO effects can be independently imparted in association with individual musical tones. According to electronic musical instruments having the aforementioned combination mode, it is typical to independently impart the LFO effects, such as the LFO vibrato and LFO tremolo (growl) for individual tone generating operations.

As regards the delayed LFO characteristic, with electronic keyboards or the like in use, with all musical tones being currently put off, after the LFO effect having the delay characteristic is imparted to that musical tone whose generation has started first, an LFO effect synchronous with the delay characteristic accompanying LFO effect given to the first musical tone is imparted to those musical tones following the first one. The greater the time elapsed from the start of generation of the first musical tone, therefore, the less the influence of the delay, so that the oscillation amplitude caused by the LFO effect approaches a predetermined value. Such a control mode in electronic keyboards or the like would cause no inconveniences or problems and natural musical tone would be generated.

In a case where different timbres are mixed, e.g., two or more tones are mixed and are simultaneously generated at each note ON time, however, independent LFO effects would be imparted to those musical tones which have the mentioned individual timbres and are to be generated. As a result, for the LFO vibrato, dissonance may occur, and for the LFO tremolo, an irregular swell may occur between musical tones, which is likely to inconvenience the musical performance.

As regards the delay characteristic of the LFO effects, according to electronic guitars or the like, the player's operations are independently executed for the individual strings and tone controls based on the operations are nearly independently performed for the individual strings. If the LFO effect accompanied by the delay characteristic is imparted to musical tones under such a control that the delayed LFO effect would be given to consecutively generated musical tones in synchronism with the effect given to the first generated musical tone, not only the musical expressions of the electronic guitars would be impaired but also the player and listeners would feel unpleasant.

Since the aforementioned tone generator module having a multi-channel mode basically functions as an electronic keyboard, controlling the delayed LFO effect is the same manner as given for the electronic keyboard. Simple connection of an electronic guitar or the like to this tone generator via a MIDI or the like cannot provide the LFO effect having the expected delay characteristic.

SUMMARY OF THE INVENTION

Accordingly, it is a primary object of this invention to permit a single tone generator module to execute the optimal tone generation control in accordance with a plurality of tone generation modes.

To achieve this object, the present invention is premised on an electronic musical instrument which generates musical tones based on music play data. Such an electronic musical instrument is a tone generator module which generates tone signals while controlling the pitch, volume, timbre or the like in accordance with a note ON/OFF command, pitch bender command, after touch command, timbre change command or various control change commands; those commands being input from an external unit based on, for example, the MIDI standards. The tone generator module may be realized itself as part of an electronic musical instrument having a musical operation section such as a keyboard.

The tone generator module comprises tone generating means for generating musical tones. Various types of tone generators, such as a frequency modulation type or phase modulation type digital tone generator and a PCM tone generator, may serve as this tone generating means.

The tone generator module also comprises tone generation mode selecting means for selecting an arbitrary one of a plurality of tone generation modes corresponding to a plurality of musical operation modes. These musical operation modes include a play mode based on the operation of the keyboard, pitch bend wheel, modulation wheel, volume switch, portamento switch, etc. of a keyboard instrument, a play mode based on the operation of the strings, frets, tremolo arm, etc. of an electronic guitar, a play mode based on the operation of the play switches, mouth piece, etc. of an electronic wind instrument, and a simultaneous play mode based on the sequencer operation. The tone generation mode selecting means may be a switch for selecting a tone generation mode for an electronic guitar or may be control means for selecting a tone generation mode based on selection data input via a MIDI.

The tone generator module further comprises control means which receives music play data according to the tone generation mode selected by the tone generation mode selecting means, processes the music play data based on the selected tone generation mode and controls the tone generating means to generate an associated tone signal.

In a case where, for example, a keyboard instrument is coupled to the electronic musical instrument embodying the present invention via a MIDI or the like and this electronic musical instrument is operated on the basis of the musical operation of the keyboard instrument, a player uses the tone generation mode selecting means to select a tone generation mode corresponding to the play mode of the keyboard instrument. As a result, only when a MIDI channel specified by individual commands, such as a note ON/OFF command, pitch bender command, after touch command, and timbre change command or various control change commands, entered from the external keyboard instrument via the MIDI or the like, coincides with a predetermined, fixed channel, the control means receives the associated command and controls the tone generating means to generate a musical tone associated with that MIDI channel.

In a case where, for example, an electronic guitar is coupled to the present electronic musical instrument via a MIDI or the like and this electronic musical instrument is operated on the basis of the musical operation of the electronic guitar, a player uses the tone generation mode selecting means to select a tone generation mode corresponding to the play mode of the electronic guitar. As a result, when a MIDI channel specified by individual commands such as the note ON/OFF command and pitch bender command, entered from the external electronic guitar via the MIDI or the like, falls within a range of the MIDI channels corresponding to the individual strings from a predetermined, fixed channel to, for example, the fixed channel plus n channels, the control means performs tone generation controls or pitch bend controls in the MIDI channel for the individual strings independently with respect to the tone generating means. In a case of note ON, if there is a musical tone which is being generated in the same channel corresponding to the same string, the musical tone is rendered off with a reverberation, for example, and a new musical tone is to be generated. With regards to the after touch command, timbre change command or various control change commands, only when a MIDI channel specified by the individual commands, coincides with the aforementioned fixed channel, the control means receives these commands and commonly controls all the musical tones of the MIDI channels corresponding to the individual strings from the fixed channel to this channel plus n channels, in accordance with the commands.

Further, in a case where, for example, an electronic wind instrument is coupled to the present electronic musical instrument via a MIDI or the like and this electronic musical instrument is operated on the basis of the musical operation of the electronic wind instrument, a player uses the tone generation mode selecting means to select a tone generation mode corresponding to the play mode of the electronic wind instrument. Consequently, with regard to the note ON/OFF command, pitch bender command, and timbre change command or various control change commands, entered from the external electronic wind instrument via the MIDI or the like, the control means performs the same control as done in the tone generation mode corresponding to the play mode of the keyboard instrument. With regard to the after touch command, the control means converts it into a volume or timbre parameter based on a conversion characteristic specific to wind instruments and controls the tone generating means.

In a case where, for example, a sequencer is coupled to the present electronic musical instrument via a MIDI or the like and this electronic musical instrument is operated on the basis of the musical operation of the sequencer, a player uses the tone generation mode selecting means to select a tone generation mode corresponding to the simultaneous play mode of the sequencer. As a result, only when MIDI channels specified by individual commands, such as the note ON/OFF command, pitch bender command, after touch command, and timbre change command or various control change commands, entered from the external sequencer via the MIDI or the like, coincide with the individual MIDI channels for simultaneous musical performance, the control means independently controls the tone generating means.

A tone generation mode may further be selectively provided in which two timbres are simultaneously generated for musical tones corresponding to the individual channels in a case where a tone generation mode other than the one corresponding to the simultaneous play mode based on the sequencer operation is selected.

As described above, the present invention can realize an electronic musical instrument which can generate a musical tone in the optimal tone generation mode depending on a fact that from in which musical operation mode input music play data is generated.

It is another object of the present invention to realize the optimal tone generation control for a tone generation mode in which musical tones with a plurality of timbres are simultaneously generated in response to note ON start command and other tone generation modes.

It is a further object of the present invention to realize the optimal tone generation control according to the individual tone generation modes of an electronic guitar or the like and other electronic musical instruments, particularly, a control for imparting an LFO effect accompanied with a delay characteristic.

To achieve the objects, the present electronic musical instrument comprises tone generating means for simultaneously generating a plurality of tone signals having the same frequency and different timbres for each note ON start command. Various types of tone generators, such as a frequency modulation type or phase modulation type digital tone generator and a PCM tone generator, may serve as this tone generating means. The tone generating means may be of a type which can generate tone signals based on, for example, time-divisional control independently for the individual time divided timings. This means simultaneously assigns a plurality of (e.g., two, three or four) time divided timings upon each input of, for example, a note ON/OFF command and starts generating musical tones with different timbres for the respective time divided timings.

The present electronic musical instrument comprises first modulation imparting means for imparting a common low frequency modulation to a plurality of tone signals having different timbres, which are to be simultaneously generated by the tone generating means for each note ON start command. This means imparts, for example, an LFO vibrato effect having a delay characteristic or an LFO tremolo (growl) effect having a delay characteristic to the simultaneously-generated tone signals synchronously.

According to the present invention, the tone generating means may be designed to be able to generate tone signals in other tone generation mode than the above-mentioned mode in which a plurality of tone signals having different timbres are simultaneously generated for each note ON start command. In this case, in addition to the first modulation imparting means, the present electronic musical instrument comprises second modulation imparting means for imparting to tone signals a low frequency modulation according to the other tone generation mode and first selecting means for switching between the first and second modulation imparting means according to the tone generation mode. The mentioned other tone generation mode may be an ordinary tone generation mode in which only one musical tone is generated for each note ON start command, a tone generation mode in which a musical tone is generated with its timbre being changed according to the note number or the like given at the note ON time, or a tone generation mode in which a plurality of tone signals having different pitches are simultaneously generated for each note ON start command. The second modulation imparting means independently imparts a low frequency modulation for each tone signal for each note ON start or for a plurality of simultaneously-generated tone signals having different pitches. It should be understood that the second modulation imparting means may cope with other various types of possible modulation modes different from the modulation mode for the first modulation imparting means.

Further, according to the present invention, the tone generating means may be designed to be able to select an arbitrary one of a plurality of tone generation modes corresponding to a plurality of musical operation modes and independently generate a plurality of tone signals in the selected mode, in addition to the above-mentioned tone generation modes. The musical operation modes may include a musical operation mode for an electronic guitar and a musical operation mode for a different instrument, such as a keyboard instrument or an electronic wind instrument. The tone generating means may be of a type which can generate independent tone signals in polyphonic for each time divided timing based on a time divisional control.

In this case, the present electronic musical instrument comprises third modulation imparting means for imparting a low frequency modulation to a tone signal for each note ON command for starting tone generation from a state in which all the tone signals are set off in the tone generating means; according to this low frequency modulation, the modulation degree gradually increases starting from the note ON start time and reaches a given modulation degree after a predetermined time. The third modulation means imparts, for example, an LFO vibrato effect having a delay characteristic or an LFO tremolo (growl) effect having a delay characteristic in such a manner that the width or degree of the oscillation (hereinafter referred to as amplitude) of the same effect gradually increases from zero in a given period of time from the note ON start time for each tone signal and reaches a given amplitude thereafter.

The present electronic musical instrument further comprises fourth modulation imparting means for imparting a low frequency modulation according to which the modulation degree gradually increases starting from the note ON start time and reaches a given modulation degree after a predetermined time, to the first one of tone signals to be generated based on a note ON start command from a state in which all the tone signals are rendered off in the tone generating means, and for imparting a low frequency modulation to those tone signals to be generated in response to note ON start commands following the first one in synchronism with the low frequency modulation imparted to the first tone signal generated. This fourth modulation imparting means imparts, for example, an LFO vibrato effect having a delay characteristic or an LFO tremolo (growl) effect having a delay characteristic to a tone signal whose generation starts in response to the first note ON command from a note OFF state in such a manner that the amplitude of the same effect gradually increases from zero in a given time from the note ON start time of that tone signal and reaches a given amplitude thereafter, and imparts the same effect as the LFO vibrato effect or the like imparted to the first tone signal generated, to those tone signals whose generation starts in response to note ON commands following the first one.

The present electronic musical instrument comprises second selecting means for selectively driving the third or fourth modulation imparting means in accordance with a tone generation mode selected in association with the musical operation mode. This means selectively drives the third modulation imparting means when a tone generation mode correspondable to the musical operation mode for an electronic guitar is selected and selectively drives the fourth modulation imparting means when a tone generation mode correspondable to a musical operation mode for other musical instrument than the electronic guitar.

The third and fourth modulation imparting means function in parallel to the first modulation imparting means. Alternately, the selectively operative first or second modulation imparting means functions in parallel to the third or fourth modulation imparting means.

With the above arrangement, the tone generating means first simultaneously generates a plurality of tone signals having different timbres for each note ON start command.

In executing such a tone generation, the first modulation imparting means imparts, for example, the LFO vibrato effect accompanied with the delay characteristic synchronously to tone signals which are simultaneously generated in response to a single note ON start command. This can ensure such a control as to give a natural LFO vibrato effect, for example, to a plurality of timbres of simultaneously-generated tone signals.

In a case where the tone generating means can generate musical tones in another tone generation mode than in addition to the above mode, the first selecting means drives the second modulation imparting means, not the first modulation imparting means, for tone generation in the another tone generation mode to thereby impart a low frequency modulation suitable for that mode to the associated musical tone. In other words, for example, the LFO vibrato effect can be imparted to the individual musical tones quite dependently.

Further, in a case where in accordance with the aforementioned control of imparting the low frequency modulation, the tone generating means can generate musical tones in individual tone generation modes associated with, for example, an electronic guitar and another electronic musical instrument, this tone generating means can execute the following low frequency modulation imparting control.

In a tone generation mode of a keyboard or the like other than an electronic guitar, for example, the second selecting means drives the fourth modulation imparting means. For instance, when the first musical tone is rendered ON (note ON) in a delay vibrato, the amplitude of the pitch of that musical tone gradually increases from zero with the pitch provided at the note ON time being the center and reaches to a given level after a predetermined delay time, and the pitch periodically changes with the given amplitude thereafter. For the note ON of the second musical tone, third musical tone and so forth, the LFO effect can be imparted in such a manner that the amplitude of the delay vibrato increases in synchronism with the delay vibrato of the first note ON.

A tone generation mode of an electronic guitar, for example, the second selecting means drives the third modulation imparting means. For instance, when the first musical tone, second musical tone, third musical tone and so forth are rendered note ON in a delay vibrato, an LFO effect can be imparted in such a manner that the amplitudes of their pitches independently and gradually increase from zero with the pitches given at the time of the individual note ON times being reference points.

The above control when combined with the operation of the first modulation imparting means or second modulation imparting means can permit the optimal LFO effect to be imparted to tone signals which are generated in individual tone generation modes.

BRIEF DESCRIPTION OF THE DRAWINGS

The other objects and characteristics of the present invention are to be understood by one skilled in the art according to the description of preferred embodiments of the present invention with reference to the accompanying drawings in which:

FIG. 6 illustrates a tone generation mode table;

FIG. 7 is a diagram illustrating the structure of tone generation mode setting key switches;

FIGS. 8A to 8G are diagrams illustrating display examples for the individual modes;

DETAILED DESCRIPTION OF THE PREFERRED EMBODIMENTS

Preferred embodiments of this invention will now be described referring to the accompanying drawings.

Arrangement of First Embodiment

Figure 1:
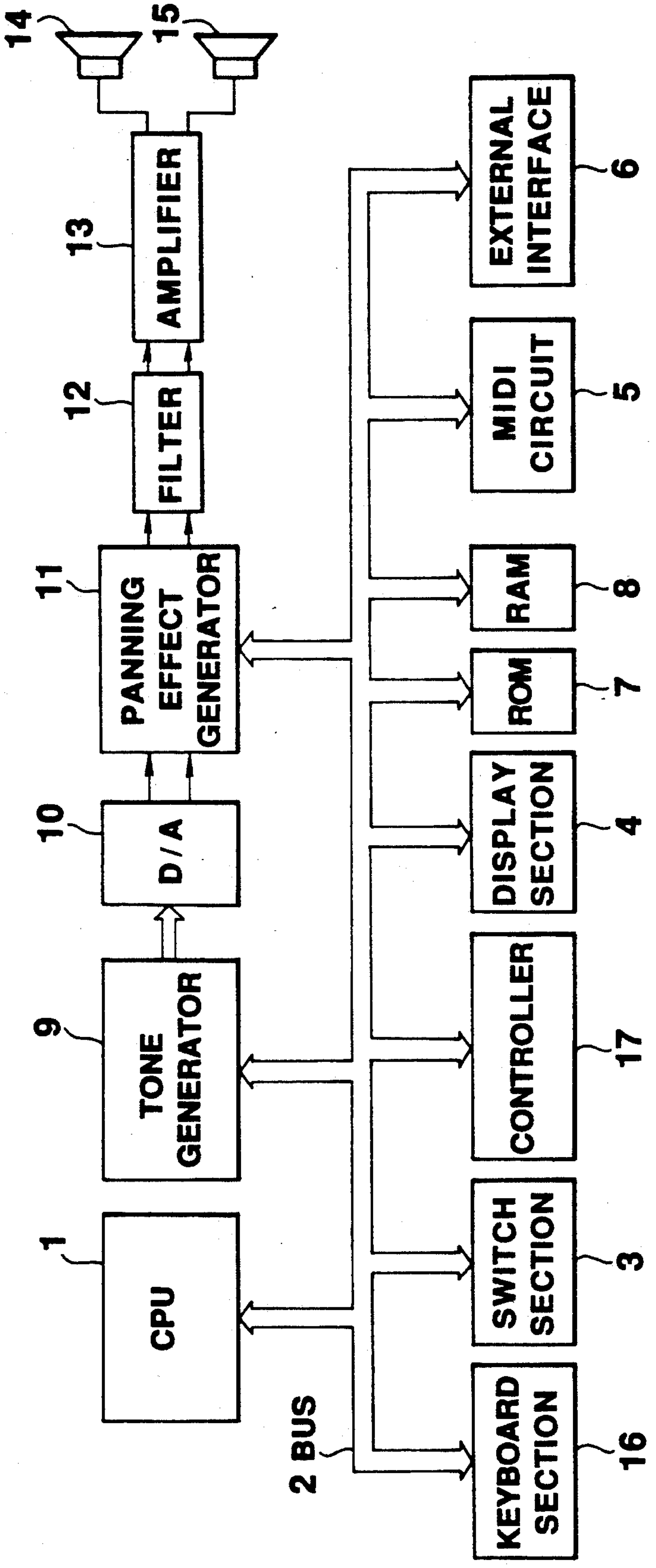
FIG. 1 is a diagram illustrating the arrangement of an electronic musical instrument according to one embodiment of the present invention.

FIG. 1 illustrates the arrangement of an electronic musical instrument according to the first embodiment of the present invention. This embodiment is realized as an electronic musical instrument of a tone generator module type which receives an external MIDI command (including data; the same will apply to the following description) and controls a tone generator based on the command to generate the associated musical tone. Alternately, as shown in this diagram, the electronic musical instrument may be realized as part of a keyboard instrument or the like which has a keyboard section 16 or a controller 17. The controller 17 may be an operational element, such as a bender wheel for arbitrarily changing the pitch when a music is played or a definable wheel for ensuring arbitrary data change with respect to one of or a plurality of pre-set tone constituting elements. Unless otherwise specified, the electronic musical instrument will be described hereafter as a tone generator module which is controlled on the basis of an external MIDI command.

A central processing unit (CPU) 1 processes data from individual processing section (to be described later) and sends control data for controlling the individual processing sections to thereby perform the general control of the electronic musical instrument.

A switch section 3 has various switches including a switch for switching the timbre, a switch for switching for a play mode (to be described later), and switches for changing the set states of various control data, play mode setting data, timbre data, etc., or a volume for changing the value of data. These items of switch data are fetched via a bus 2 in the CPU 1 and processed there. The processed data is then set or sent to the individual processing systems.

A display section 4, comprising an LED or LCD display or the like, causes such a display element to display the present play status, set data values, system setting status and the like in accordance with data sent via the bus 2 from the CPU 1.

A MIDI circuit 5 is an interface circuit, which receives a signal, externally input according to the MIDI standards, for controlling the present tone generator module and transfers it over the bus 2 to the CPU 1 or transfers a signal, sent over the bus 2 from the CPU 1, for controlling an external electronic musical instrument to this external unit in accordance with the MIDI standards.

An external interface circuit 6 fetches data, a program or the like stored in an IC card or writes data, a program or the like onto the IC card.

A ROM 7 is a read only memory in which a program for operating the present tone generator module, timbre data, music play data, etc. are stored.

A RAM 8 is a random access memory which temporarily stores data used in the mentioned program, timbre data, timbre control data, music play data or play status data or the like.

A tone generator 9 generates a musical tone with its timbre set and its tone generation mode being controlled on the basis of control data sent over the bus 2 from the CPU 1. Various digital tone generating circuits, such as a PCM tone generator type, a frequency modulation type and a phase modulation type, may serve as this tone generator 9.

A D/A converter 10 converts digital tone data from the tone generator 9 into a stereo analog tone signal.

A panning effect generator 11 imparts a panning effect to the stereo analog tone signal from the D/A converter 10 to automatically change the localization of the right and left channels. The status of the panning effect is controlled by a control signal coming from the CPU 1 via the bus 2.

A filter 12 eliminates the unnecessary frequency components from stereo tone signals from the panning effect generator 11 and functions independently for the right and left channels.

An amplifier 13 amplifies the stereo outputs independently for the right and left channels, and the amplified stereo tone signals are supplied to the respective loudspeakers 14 and 15 so that a corresponding musical sound is generated. If the present embodiment is realized as a tone generator module, the amplifier 13 and loudspeakers 14 and 15 may be omitted and the stereo tone signals from the filter 12 may be output to an external audio system coupled to the tone generator module.

The keyboard section 16 and controller 17, as already described, are elements in a case where this embodiment is realized as part of a keyboard instrument, and do not directly relate to the present invention, so that their operational description will be omitted here.

Basic Operational Flow of Present Embodiment

The operation of the electronic musical instrument having the above arrangement will now be described. It should be understood that the individual operational flowcharts, which will be described below, are executed as the CPU 1 in FIG. 1 functions in accordance with a program stored in the ROM 7.

Figure 4:
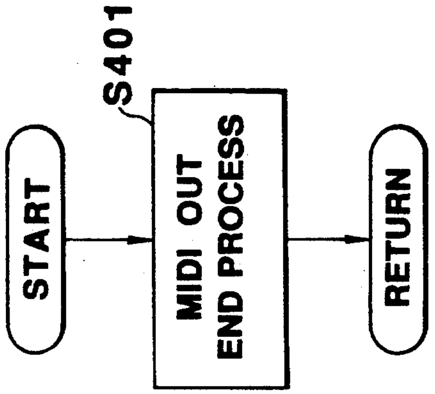
FIG. 4 is an operational flowchart executed when there is a MIDI output.
Figure 5:
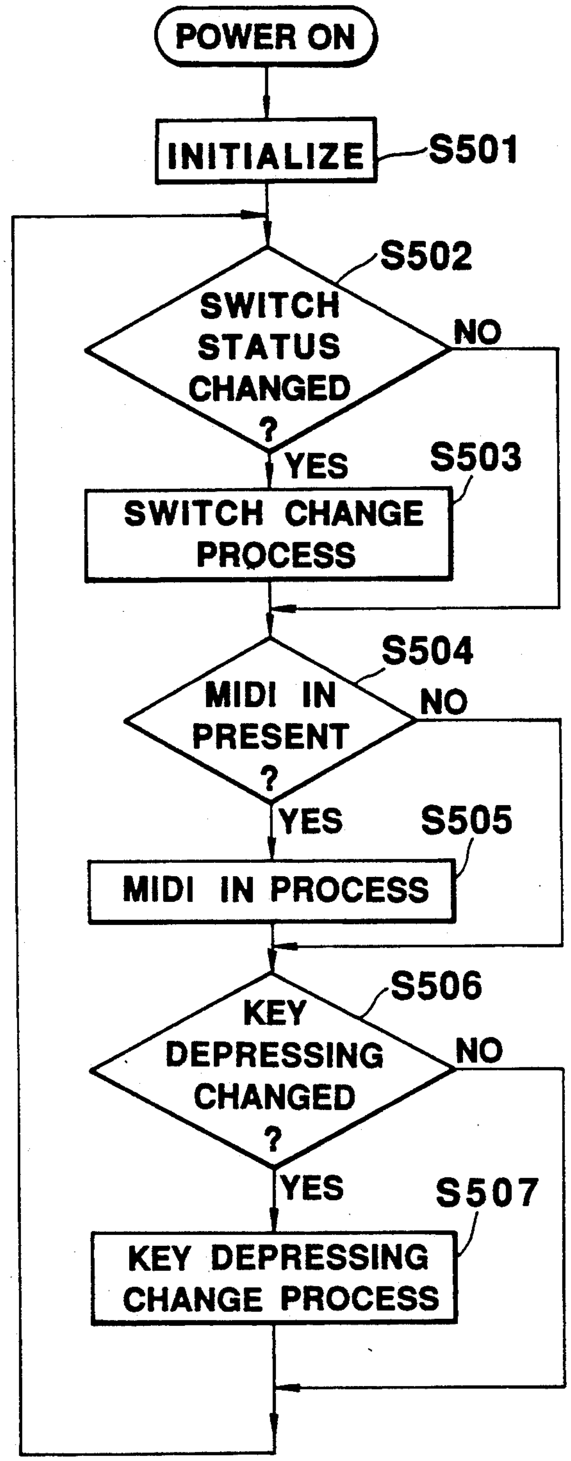
FIG. 5 is a general operational flowchart.

The electronic musical instrument according to this embodiment starts the general operational flowchart shown in FIG. 5 upon power ON and repeatedly executes it. This electronic musical instrument also executes the operational flowcharts as shown in FIGS. 2 to 4, 18 and 19 through an interrupt process. FIGS. 9 and 11 to 17 present detailed illustrations of the individual processes in the general operation flowchart shown in FIG. 5.

To begin with, the basic operational flow of the present embodiment will be described in accordance with the operational flowcharts shown in FIGS. 2 to 5, referring to the individual processing sections in FIG. 1 from time to time.

Figure 2:
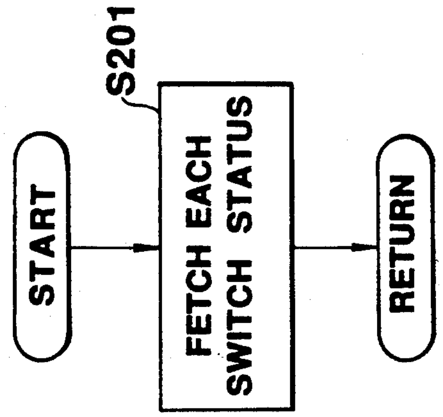
FIG. 2 is an operational flowchart for fetching a switch status.

FIG. 2 illustrates a process flow which is executed by priority over the general operational flowchart shown in FIG. 5 based on an interruption from a timer (not shown) in the CPU 1, which occurs in a given period. In S201 the status of each switch of the switch section 3 is fetched read into an area (not particularly shown) in the RAM 8. After executing this process, the flow returns to the general operation flowchart in FIG. 5.

Figure 3:
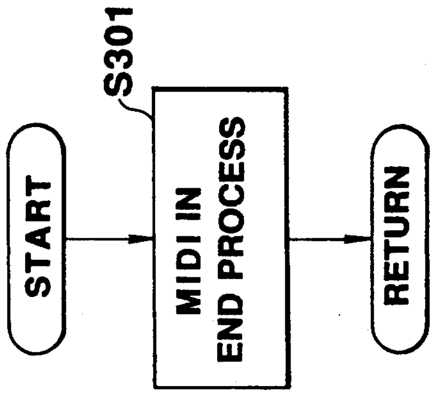
FIG. 3 is an operational flowchart executed when there is a MIDI input.

FIG. 3 illustrates a process flow which is executed by priority over the general operational flowchart shown in FIG. 5 based on an interruption from the MIDI circuit 5 when the MIDI circuit 5 receives a MIDI command from an external unit (not particularly shown). In S301 the MIDI command received by the MIDI circuit 5 is fetched into an area (not particularly shown) in the RAM 8 and a flag indicating the occurrence of a MIDI input is set in an area (not particularly shown) in the RAM 8. After executing this process, the flow returns to the general operation flowchart in FIG. 5.

FIG. 4 illustrates a process flow, which is executed when the present embodiment is realized as part of a keyboard instrument that comprises the keyboard section 16 and controller 17 and which, when these elements are operated, outputs the operation data to an external unit. In S401 the data is output as a MIDI command through the MIDI circuit 5 by an interruption originated from the operation of the elements. It should be understood that this process is an ordinary process for outputting a MIDI command and is not directly associated with the present invention.

As already mentioned, FIG. 5 illustrates the general operation flowchart repeatedly executed by the CPU 1.

When power is given, an initialization process such as initial setting to the tone generator 9, setting of initial display data for the display section 4 and initialization of various control data, arithmetic operation data and the like in the RAM 8, is executed in S501.

In the subsequent step S502, it is determined whether or not a change has occurred in status of the switch section 3. Switch data subjected to the discrimination in this step is the switch data detected and fetched in the RAM 8 in the interrupt process shown in FIG. 2.

If a change in switch status is detected in S502, a switch change process is executed in S503, where all the necessary processes are executed in accordance with the system status. These processes include, beside the setting of a play mode particularly associated with the present invention, setting of timbre data, setting of MIDI control data, setting of panning (PAN) control data and changing each data, setting of tone control data for the tone generator 9, setting of data to the display section 4, initialization of control data, controlling the panning effect generator 11, exchanging of data or a program with an IC card or the like via the external interface 6 and controlling a MIDI. This section is specially associated with this invention, and the operation associated with this invention will be described in detail later. After executing the process in S503, the flow advances to S504.

If no change in switch status is detected in S502, the flow advances to S504 without executing the switch change process in S503.

In S504, it is discriminated whether or not a MIDI command has been input via the MIDI circuit 5. As already explained, a flag for discriminating the presence/absence of the MIDI input is set in the RAM 8 by the interrupt process shown in FIG. 3.

If there is a MIDI input detected in the above discrimination, a MIDI IN process is executed in S505. In this process, the input MIDI command is identified and various processes will be executed in association with this command according to the system status and set data. The various processes may include alteration of the internal play mode, alteration of timbre data, alteration of PAN control data, alteration of tone control data and all the processes that should be done for the above alterations, or tone control, display data control and MIDI control. This section is also specially associated with the present invention, and the operation associated with this invention will be described in detail later. After executing the process in S505, the flow advances to S506.

If no MIDI input is detected in S504, the flow advances to S506 without executing the MIDI IN process in S505.

In S506, it is discriminated whether or not a change in key depressing on the keyboard section 16 has occurred. As already explained in the section "Arrangement of First Embodiment," this process is executed when the present embodiment is realized as part of a keyboard instrument having the keyboard section 16. In order to reflect the operation of the keyboard itself onto tone generation control, occurrence/non-occurrence of a change in key depressing is discriminated in S506.

If key depressing or releasing is done, a key depressing change process is executed in S507. This process, which includes alteration of data associated with the key depressing/releasing operation, tone assigning, note ON process, note OFF process, and MIDI control, is the same as is done in the ordinary operation of a keyboard instrument and is not directly associated with the present invention. Therefore, a detailed description of this process will be omitted here.

After the above process is executed or if no change in key depressing is detected in S506, the flow returns to S502 and the sequence of processes S502 to S507 is repeated.

In a case where the present embodiment is realized as an electronic musical instrument of a tone generator module type which does not have the keyboard section 16, S506 and S507 need not be executed.

Summary of Tone Generation Modes in the Embodiment

Of the basic operation flow of this embodiment as described above, those portions which are particularly associated with the present invention are the switch change process in S503 and the MIDI IN process and the interrupt-invoked control data change process in S505 in the general operation flowchart shown in FIG. 5. Before going into a detailed description of these processes, the tone generation modes of the electronic musical instrument according to this embodiment will be briefly described.

According to this embodiment, the electronic musical instrument is realized as a tone generator which can simultaneously generate 8 musical tones at a maximum (this number being hereafter called a polyphonic number or simply poly) and can generate 8 timbres at a maximum.

The present electronic musical instrument has three play modes, normal mode, combination mode and multi poly mode. In normal mode, 8 poly tones with a single timbre can be generated. In combination mode, there are two tone generating areas to each of which 4 poly tones with one timbre can be assigned. In other words, it is possible to generate a musical tone having two timbres mixed with 4 poly tones. In multi poly mode, there are 8 tone generating areas to each of which 0 to 8 poly tones with one timbre can be assigned. It should be understood that the total poly number for the entire areas in multi poly mode never becomes greater than 8.

Further, of the three play modes, the normal mode and combination mode permits alternate selection of a keyboard mode, guitar mode and wind mode, whereas the keyboard mode is fixedly set in the multi poly mode.

FIG. 6 table illustrates tone generation modes of this embodiment in a case where each MIDI command is input through the MIDI circuit 5 (FIG. 1) in the above individual play modes. In the table, the note ON/OFF command specifies the start of tone generation or the end of tone generation, the pitch bender command specifies a pitch bend (pitch alteration), and the after touch command specifies an after touch (keying pressure after key depression or the like). Further, the timbre change command specifies alteration of a timbre to be generated, and the control change command specifies alteration of various controls such as the modulation wheel, foot volume, portamento data, master volume and foot switch.

If the keyboard mode is selected as the first play mode in normal mode in FIG. 6, the present electronic musical instrument functions in response to all commands, namely, the note ON/OFF, pitch bender, after touch, and timbre change and control change, only when a predetermined, fixed MIDI channel is specified; commands for other MIDI channels in this case will be disregarded.

If the guitar mode is selected as the second play mode in normal mode, the present electronic musical instrument functions in response to the note ON/OFF and pitch bender commands independently in association with the individual MIDI channels from a predetermined, fixed MIDI channel to a channel higher by 5 this MIDI channel. For instance, when the predetermined MIDI channel is 1, the instrument functions independently for $1+5=6$ channels. This is because MIDI channels for commands input from a string instrument such as a guitar are often independently set for the respective strings (e.g., the first to sixth strings are assigned to channels 1 to 6), and the note ON/OFF (corresponding to picking of each string) and the pitch bender (corresponding to a choking operation for each string) are given for each string. With regard to the after touch command, and timbre change and control change commands, each command is accepted only when a predetermined, fixed MIDI channel of the lowest string channel of the above six channels is specified and it is executed simultaneously for six strings corresponding to the specified channel till the channel higher by 5 therefrom. As the timbre change or the like is simultaneously specified for six strings, the command is permitted to be executed commonly for the six strings by sending it using only that MIDI channel which corresponds to the lowest string, thus preventing redundant transferring of the same command independently to the individual strings.

If the wind mode is selected as the third play mode in normal mode, which is the same as the case where the keyboard mode is selected, when the after touch command is input, a conversion curve for converting the data of the after touch command into volume/timbre parameters (this curve being hereinafter referred to as after curve) is set as an after curve specific to a wind instrument. In guitar mode as shown in FIG. 6, an after curve similar to the one involved in keyboard mode is set. The reason why setting is changed only for the wind mode is that, with the use of a wind instrument, the volume or the like is often controlled by the after touch, but after touch data is always small at the rising of a tone so that if the after touch control is executed in the same manner as that in keyboard mode, the tone rising is always delayed, thus giving unnatural musical performance. The LFO effect in guitar mode may be imparted to an exclusive touch key or the like provided on the guitar body. An after curve or an algorithm for determining the curve may be stored in the ROM 7 (FIG. 1), and the same curve is referred to under the control of the CPU 1 based on data of the after touch command entered and is converted into parameters of tone volume/timbre before being output to the tone generator 9.

In contrast to the normal mode, the same as explained above for the first to third play modes of the normal mode can apply to the combination mode which is the fourth play mode, except that two timbres are simultaneously generated as shown in FIG. 6 and the poly number becomes 4 in combination mode.

In multi poly mode as the fifth play mode, only the keyboard mode can be set in this embodiment on the assumption that the present electronic musical instrument is used as a tone generator of a sequencer in multi poly mode. Each of the note ON/OFF, pitch bender, after touch, timbre change and control change commands is effective for tone generating areas of those channels coincident with the MIDI channels independently set for 8 tone generating areas.

Described above, an important feature of this embodiment lies in that the normal mode, combination mode and multi poly mode can be selected and, depending on whether an external electronic musical instrument coupled is a keyboard, an electronic guitar, an electronic wind instrument, or the like, the optimal tone generation control for each such external unit can be executed.

Further, according to this embodiment, the LFO vibrato effect, particularly, the delay characteristic, is imparted to a musical tone rendered note ON. The LFO vibrato effect is such an effect that the pitch of a musical tone is periodically oscillated around the note ON pitch in accordance with a low frequency waveform (LFO waveform). Particularly, the delay vibrato effect is such an effect that the oscillation is small immediately after note ON, and increases to a given amplitude after a predetermined delay time and the pitch periodically changes with the given amplitude thereafter. In this case, different operations will be performed as follows, depending on when the guitar mode is selected (the second play mode and part of the fourth play mode) or not selected (the first play mode, the third play mode, part of the fourth play mode and the fifth play mode).

Figure 22A:
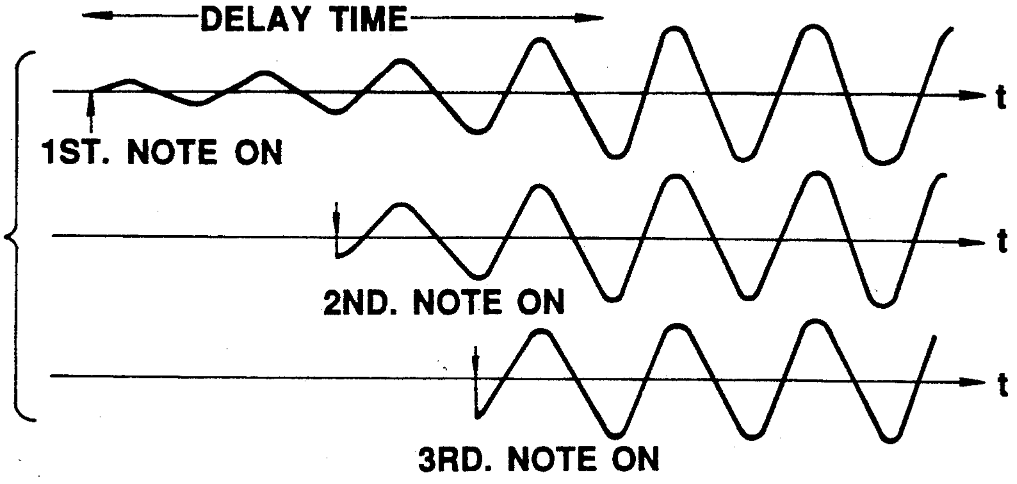
FIGS. 22A and 22B are diagrams illustrating LFO vibrato waveforms.

In a case where the guitar mode is not selected, when the first musical tone is rendered note ON (1st note ON), as shown in FIG. 22A, the pitch of that musical tone gradually increases from zero with the note ON pitch being the center and reaches to a given level after a predetermined delay time (see "delay time" in the diagram), and the pitch periodically changes with the given amplitude thereafter. For the note ON of the second musical tone, third musical tone and so forth (2nd note ON, 3rd note ON, . . . ), the delay vibrato in this case is synchronized with the delay vibrato at the time of 1st note ON and the amplitude increases with the same value, as shown in FIG. 22A.

In a case where the guitar mode is selected, when the first musical tone, second musical tone, third musical tone and so forth are rendered note ON (1st note ON, 2nd note ON, 3rd note ON, . . . ), the amplitudes of their pitches independently and gradually increase from zero with the respective note ON pitches being reference points.

As should be understood from the above, another feature of this embodiment lines in that the LFO vibrato (delay vibrato) effect can be imparted in such a manner that the optimal vibrato effect is given to a tone waveform in each mode irrespective of whether the guitar mode is selected or not. This effect is imparted to the note ON/OFF process and control data change process (which will be described later in detail). In the following description, the basic operations of the switch change process in S503 in FIG. 5 and the MIDI IN process and the control data change process invoked by a timer interrupt both in S505 are described first, then the LFO vibrato process will be described in detail.

Operation of Switch Change Process

The switch change process in S503 in FIG. 5 and the MIDI IN process and the interrupt-invoked control data change process in S505 in the general operation flowchart shown in FIG. 5 will now be described one by one.

First, a description will be given of the switch change process in FIG. 5 in a case where the individual play modes are set by the switch section 3 shown in FIG. 1.

FIG. 7 illustrates key switches which are part of the switch section 3 (FIG. 1) and serve to set the individual play modes. Reference numerals "18," "19" and "20" in this diagram denote switches for setting the normal mode, combination mode and multi poly mode, respectively. Reference numeral "21" is a select key for selecting the keyboard mode, guitar mode or wind mode.

FIGS. 8A to 8G illustrate examples of what is displayed on the display section 4 shown in FIG. 1 when the individual play modes are selected. In these examples, the display section 4 is constituted by a 16-character by 2-line LCD module.

FIGS. 8A to 8C present display examples when the keyboard mode, guitar mode and wind mode are respectively selected while the normal mode is selected. The underlines below the characters "K," "G" and "W" denote cursors which are blinking. Every time the select key 21 in FIG. 7 is depressed, the display changes from that of FIG. 8A to that of FIG. 8B, that of FIG. 8C, then back to that of FIG. 8A, and the play mode changes from the keyboard mode, to the guitar mode, to the wind mode, then to the keyboard mode again.

FIGS. 8D to 8F present display examples when the keyboard mode, guitar mode and wind mode are respectively selected while the combination mode is selected. The individual play modes can be selected by the select key 21 (FIG. 7) as in the case of the normal mode.

FIG. 8G presents a display example in multi poly mode; since the keyboard mode is fixed as already described, the display of "K" is omitted.

In FIGS. 8A to 8G, the word "PST1" is an abbreviation of "preset bank 1," and "A-1," "A-2" and "A-3" respectively indicate "1," "2" and "3" of the timbre bank A; these four terms specify areas where timbre data is stored. "VZ EP," "VZ BASS" and "VZ TRUMPET" indicate timbre names.

Further, "1+[2]" in FIGS. 8D–8F means simultaneous generation of two timbres, and indicates that each display example shows the timbre bank and timbre name of the tone generating area specified by the numeral encircled by □. The numeral "11111111" on the first line in FIG. 8G shows the poly number of 8 tone generating areas 1–8 sequentially from the left. In this example, FIG. 8G shows that the poly number is "1" for every tone generating area, and indicates the timbre bank and timbre name of the tone generating area specified by the numeral encircled by □.

Figure 9:
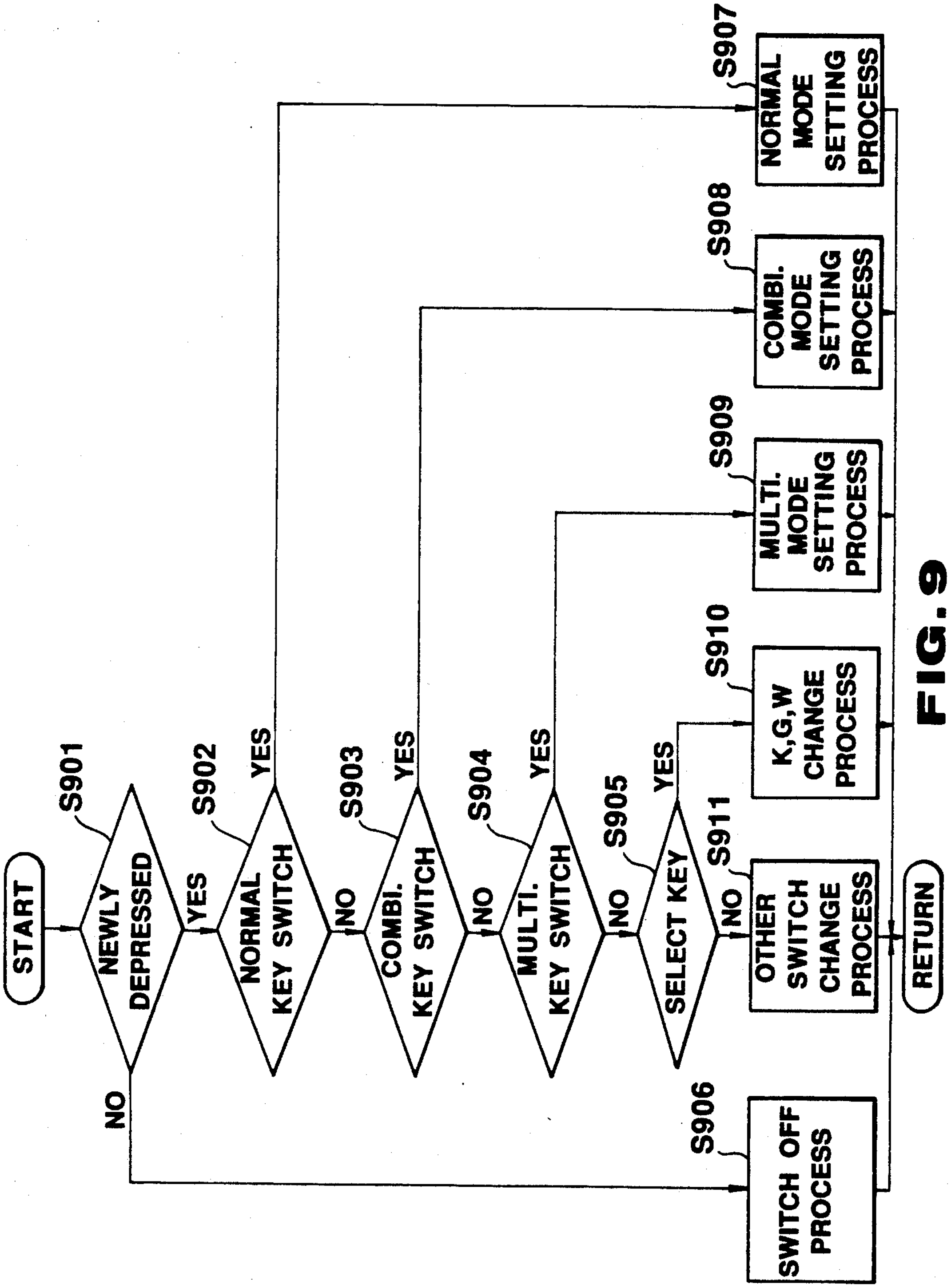
FIG. 9 is an operational flowchart executed when a change in switch status occurs.

FIG. 9 illustrates the operational flowchart of a program which is executed when the individual switches of the switch section 3 in FIG. 1 (including the individual switches 18–21 in FIG. 7) are depressed. This flowchart illustrates in detail the switch change process in S503 in the general operational flowchart shown in FIG. 5.

Referring to FIG. 9, it is discriminated in S901 whether a key switch whose status has changed is newly depressed or released instead. If the key has been released, the flow advances to S906 for execution of a switch OFF process. It should be understood that the switches 18–21 in FIG. 7 have no meaningful OFF status so that this process is terminated without executing anything in this case.

If the status-changed key switch is detected to be newly depressed, in discrimination processes S902–S905, it is discriminated whether the key switch 18 (normal mode), 19 (combination mode), 20 (multi poly mode) or 21 (select key) in FIG. 7 has been depressed. If the decision is affirmative (YES), the associated next process S907, S908, S909 or S910 is executed. If the newly depressed key switch is none of the four key switches, the associated switch change process is executed in S911. Since the process in S911 is not directly associated with the present invention, its detailed description will be omitted.

Figure 10B:
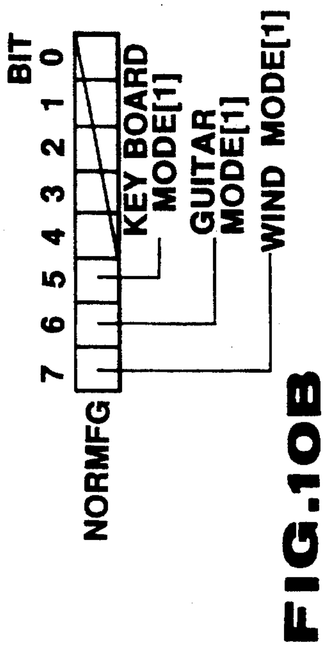
FIGS. 10A to 10C are diagrams illustrating the configuration of a tone generation mode memory.
Figure 10C:
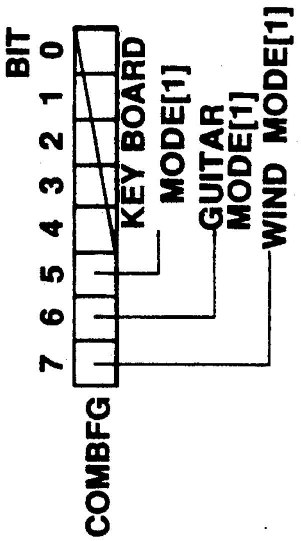
Figure 10A:
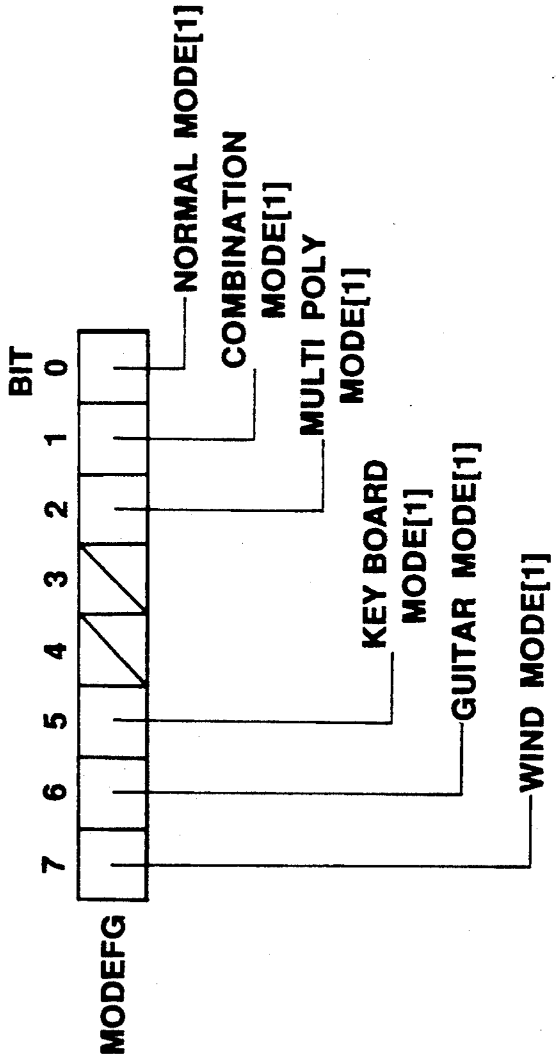

If the key switch 18 in FIG. 7 for setting the normal mode has been depressed, the flow advances from S902 to S907 where the normal mode setting process is executed. In this process, all the musical tones being generated by the tone generator 9 (FIG. 1) are set off and a flag NORMFG shown in FIG. 10B, which is an exclusive RAM (part of the RAM 8 in FIG. 1) exclusively used for the normal mode, is read out to discriminate which mode, the keyboard mode, guitar more or wind mode, is specified. As shown in FIG. 10B, the flag NORMFG has its bits 0–4 unused, and its bits 5, 6 and 7 are set to "1" when the respective keyboard mode, guitar mode and wind mode are specified. As these modes are exclusive, one of the latter three bits should always be "1." After executing the discrimination, data is set to a flag MODEFG shown in FIG. 10A which is a note ON control RAM (part of the RAM 8 in FIG. 1). Then, the memory areas (not particularly shown) on the RAM 8 necessary for tone generation control are all initialized in order to perform the operation in normal mode, as already described with reference to FIG. 6. As shown in FIG. 10A, the flag MODEFG is a 1-byte RAM and its bits 0, 1 and 2 are set to "1" when the respective normal mode, combination mode and multi poly mode are specified. As these modes are exclusive, one of the three bits should always be "1." In the normal mode setting process, bits 0, 1 and 2 of the flag MODEFG are respectively set to "1," "0" and "0." The flag MODEFG has its bits 3 and 4 unused, and its bits 5, 6 and 7 are set to "1" when the respective keyboard mode, guitar mode and wind mode are specified. As these modes are also exclusive, one of these three bits should always be "1."

If the key switch 19 in FIG. 7 for setting the combination mode has been depressed, the flow advances from S903 to S908 in FIG. 9 where the combination mode setting process is executed. In this process, all the musical tones being generated by the tone generator 9 (FIG. 1) are set off and a flag COMBFG shown in FIG. 10C, which is an exclusive RAM (part of the RAM 8 in FIG. 1) exclusively used for the combination mode, is read out to discriminate which mode, the keyboard mode, guitar more or wind mode, is specified. As shown in FIG. 10C, this flag COMBFG has exactly the same structure as the flag NORMFG shown in FIG. 10A. As in the case of the normal mode setting process, after executing the discrimination, data is set to the flag MODEFG shown in FIG. 10A, then the memory areas (not particularly shown) on the RAM 8 necessary for tone generation control are all initialized in order to perform the operation in combination mode, as already described with reference to FIG. 6.

If the key switch 20 in FIG. 7 for setting the multi poly mode has been depressed, the flow advances from S904 to S909 in FIG. 9 where the multi poly mode setting process is executed. In this process, all the musical tones being generated by the tone generator 9 (FIG. 1) are set off, and bits 0, 1 and 2 of the flag MODEFG in FIG. 10A are respectively set to "0," "0" and "1" while bits 5, 6 and 7 are respectively set to "1," "0" and "0." This is because the keyboard mode is fixed in multi poly mode, as already explained referring to FIG. 6.

If the select key 21 in FIG. 7 has been depressed, the flow advances from S905 to S910 in FIG. 9 for execution of the K, G and W change process. This process will be terminated without executing anything if the multi poly mode is selected. If the normal mode is selected, first, when bit 5 of the flag NORMFG in FIG.

10B is "1," bits 5 to 7 are respectively set to "0," "1" and "0," and when bit 6 of this flag is "1," bits 5 to 7 are respectively set to "0," "0" and "1," and when bit 7 of the flag is "1," bits 5 to 7 are respectively set to "1," "0" and "0" before executing the normal mode setting process as is done in S907. If the combination mode is selected, first, when bit 5 of the flag COMBFG in FIG. 10C is "1," bits 5 to 7 are respectively set to "0," "1" and "0," and when bit 6 of this flag is "1," bits 5 to 7 are respectively set to "0," "0" and "1," and when bit 7 of the flag is "1," bit 5 to 7 are respectively set to "1," "0" and "0" before executing the combination mode setting process as is done in S908.

Operation of MIDI IN Process

A description will now be given of the operation in a case where after the switch change process in S503 in FIG. 5 is executed to set the play mode in the above manner, a MIDI command such as the note ON/OFF, pitch bender, after touch or timbre change, is input via the MIDI circuit 5 in FIG. 1 from an external unit.

Figure 11:
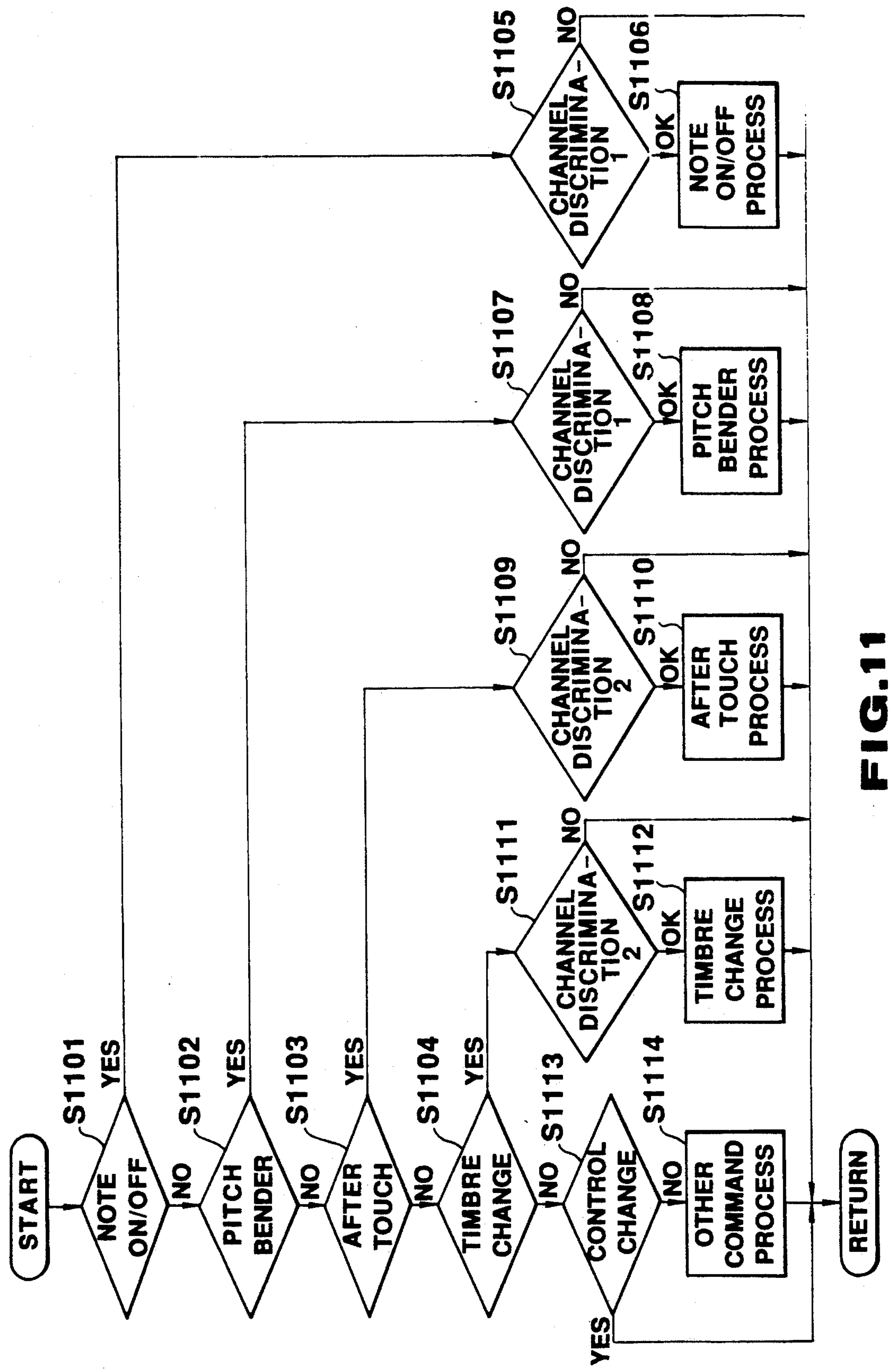
FIG. 11 is an operational flowchart for a MIDI IN process.

When each MIDI command mentioned above is input, the operational flowchart shown in FIG. 3 is executed based on an interruption from the MIDI circuit 5 and the MIDI command received at the MIDI circuit 5 is fetched in the RAM 8, as already described. This status is detected by the discrimination in S504 in FIG. 5 and the MIDI IN process in S505 is executed. FIG. 11 presents a detailed illustration of this process.

Referring to FIG. 11, in S1101–S1104, it is discriminated whether the input MIDI command is the note ON/OFF, pitch bender, after touch or timbre change. If the input command is none of those commands but is the control change command, the control data change process is executed based on a periodical interruption as described later, so that the process will be terminated without executing anything in the MIDI IN process depending on the decision made in S113. Further, if the input MIDI command is none of the above mentioned commands, it is discriminated whether the command should be disregarded or is valid in S1114. If the command is valid, then the associated process for the valid command will be executed. Such a command may be a system message not associated with a MIDI channel, such as an exclusive message, a common message, a real time message or the like, which conforms to the MIDI standards.

A description will now be given of a case where any of the note ON/OFF, pitch bender, after touch and timbre change commands is subsequently input. The following description corresponds to the brief operations in the first to fifth play modes already explained in the section "Summary of Tone Generation Modes in the Embodiment" with reference to FIG. 6.

To begin with, a description will be given of a case where the keyboard mode in normal mode is selected as the first play mode.

Figure 12:
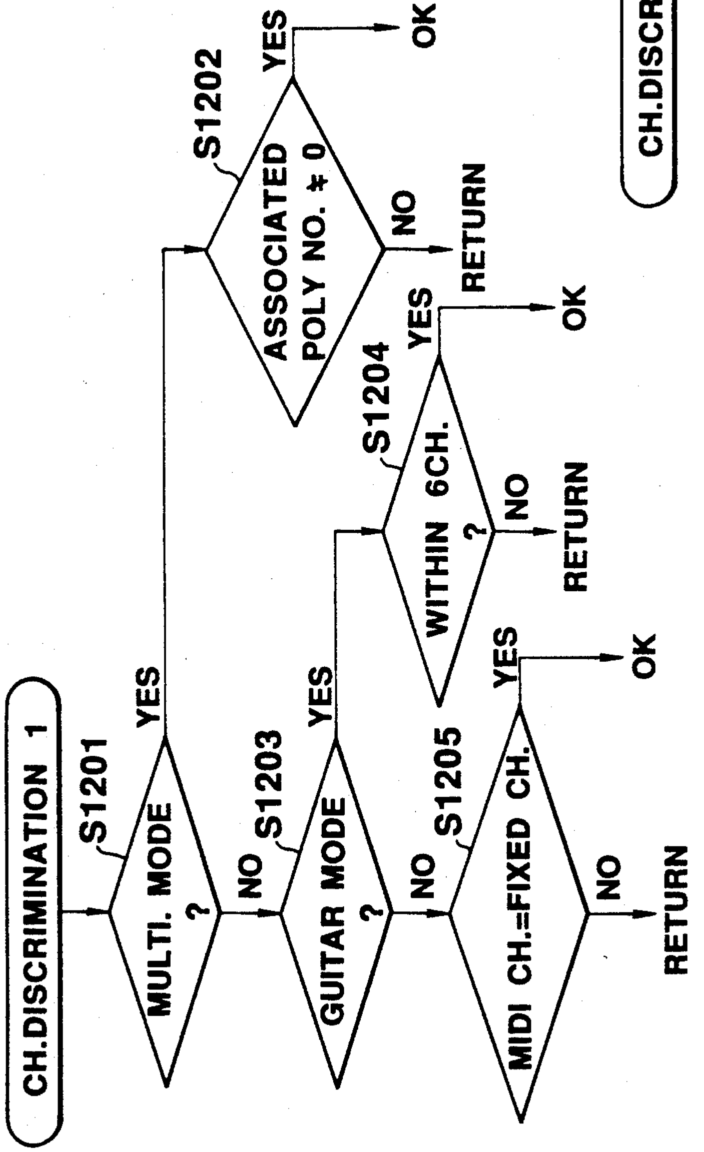
FIG. 12 is an operational flowchart for a channel discrimination 1.
Figure 14:
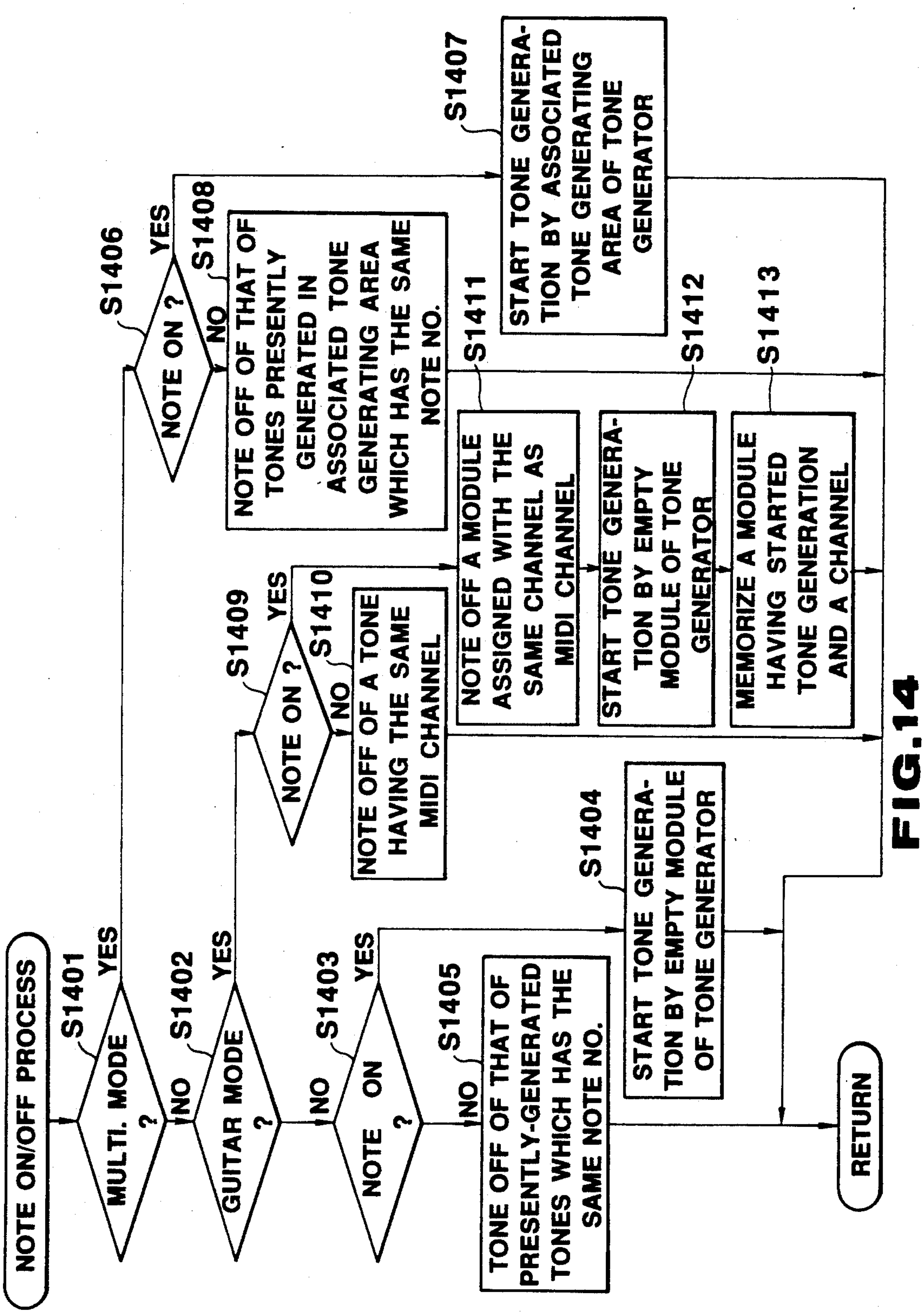
FIG. 14 is an operational flowchart for a note ON/-OFF process.

If the note ON/OFF command is input in the first play mode, the decision in S1101 in FIG. 11 becomes YES and the channel discrimination 1 in S1105 will be executed. FIG. 12 presents a detailed illustration of the channel discrimination 1. In the case of the first play mode, the decisions in S1201 and S1203 in FIG. 12 become NO and the discrimination in S1205 will be executed. Then, only when the MIDI channel specified by the input command (hereinafter simply referred to as MIDI channel) coincides with a predetermined, fixed MIDI channel (hereinafter called fixed channel), the decision in S1205 becomes YES and the flow advances to S1106 in FIG. 11 where the note ON/OFF process is executed. FIG. 14 illustrates this process. In the case of the first play mode, the decisions in S1401 and S1402 become NO and the flow advances to S1403. If the input command is the note ON command, the flow advances to S1404 and an instruction to start tone generation is given to an empty module in the tone generator 9 which is not generating a musical tone. Although no detailed description will be given, the tone generator 9 in FIG. 1 can generate 8 musical tones in parallel by a time divisional process; each time divided timing corresponding to each of the 8 musical tones is called a module in this embodiment. Although not specifically illustrated in FIG. 14, when no empty module exists, the module which started tone generation earliest, for example, is subjected to note OFF and a new note ON start instruction need to be given to that module.

If the input command is the note OFF command, the flow advances to S1405 where that of tones being presently generated by the tone generator 9 which has the same note number (hereinafter referred to as note no.) is subjected to note OFF.

Figure 15:
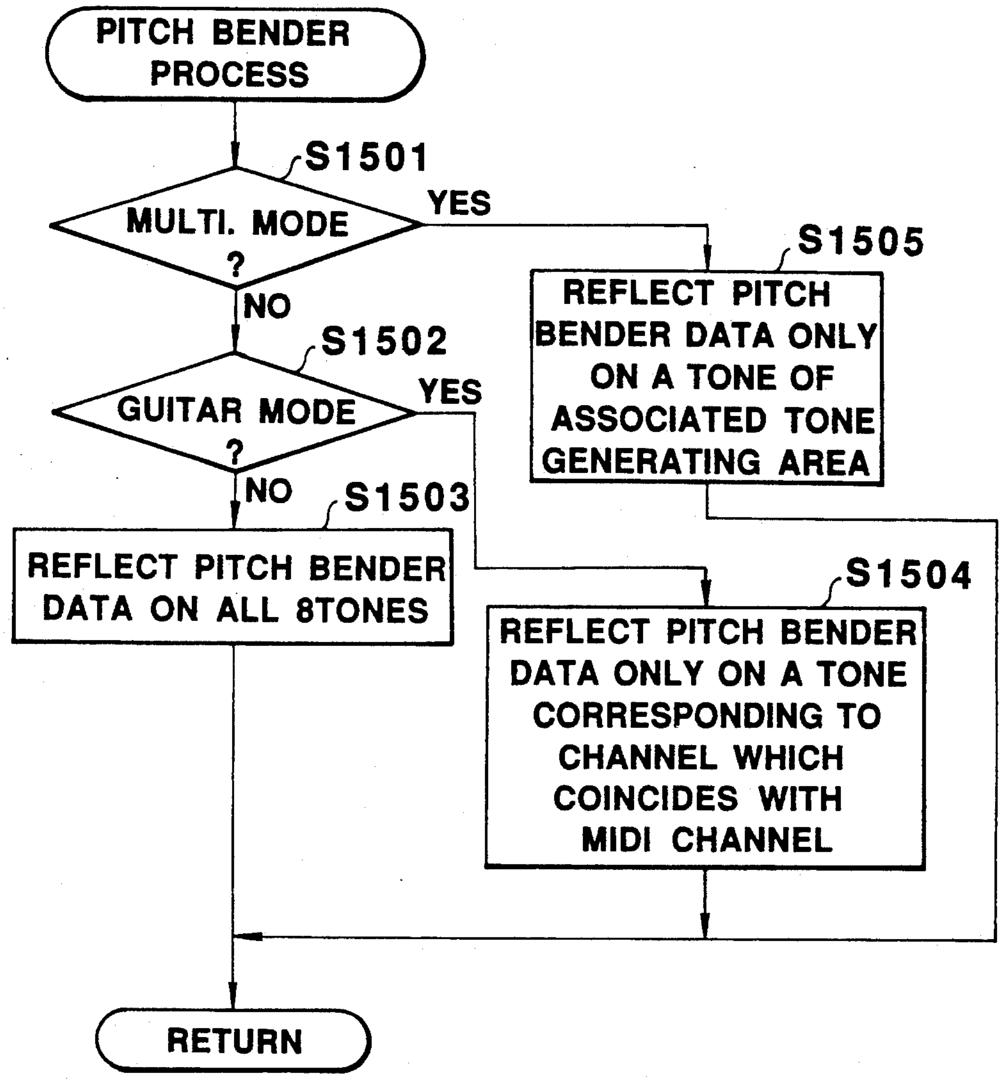
FIG. 15 is an operational flowchart for a pitch bender process.

If the pitch bender command is input in the first play mode, after the decision in S1101 in FIG. 11 becomes NO, the decision in S1102 becomes YES and the channel discrimination 1 in S1107 will be executed. As in the case of the note ON/OFF command, after the decisions in S1201 and 1203 in FIG. 12 become NO, the decision in S1205 becomes YES only when the MIDI channel coincides with the fixed channel, and the flow advances to the pitch bender process in S1108 in FIG. 11. FIG. 15 illustrates this process. In the case of the first play mode, the decisions in S1501 and S1502 become NO and the flow advances to S1503. Here, pitch bender data is reflected simultaneously on all the generatable 8 tones.

Figure 13:
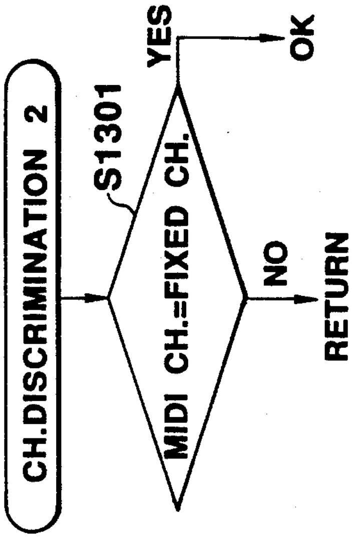
FIG. 13 is an operational flowchart for a channel discrimination 2.
Figure 16:
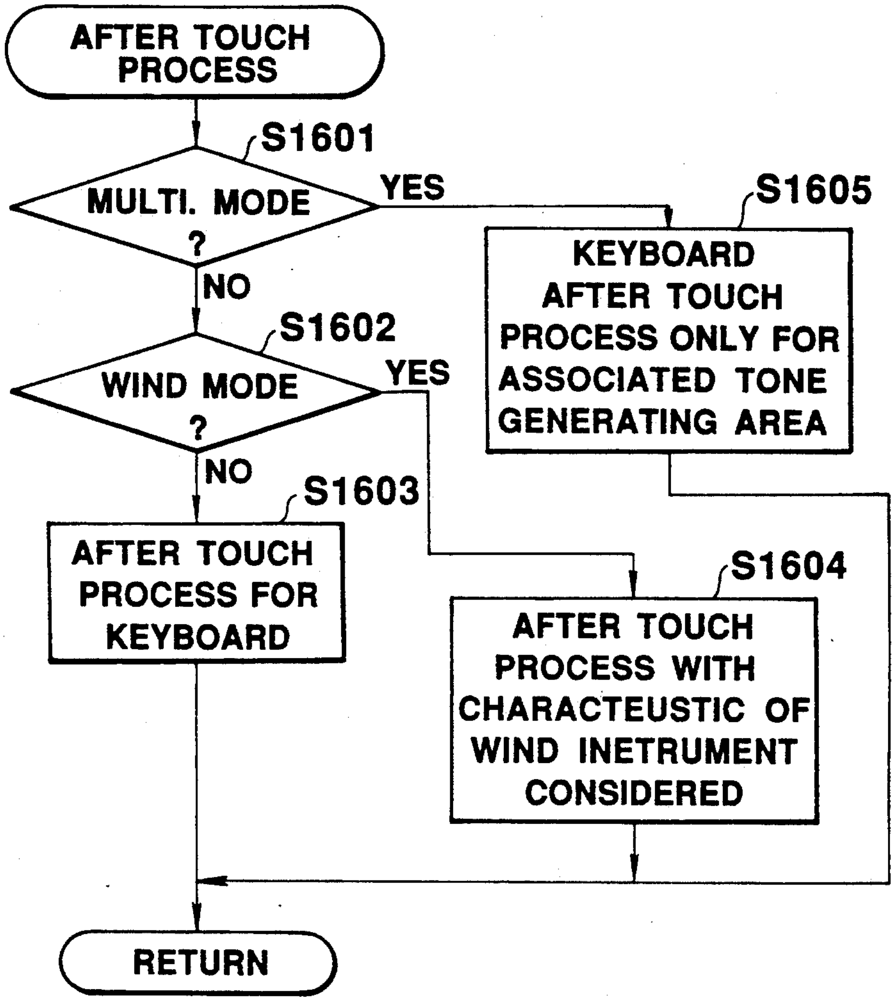
FIG. 16 is an operational flowchart for an after touch process.

If the after touch command is input in the first play mode, after the decisions in S1101 and S1102 in FIG. 11 become NO, the decision in S1103 becomes YES and the channel discrimination 2 in S1109 will be executed. FIG. 13 illustrates this process. More specifically, only when the MIDI channel coincides with the fixed channel, the decision in S1301 becomes YES and the flow advances to the after touch process in S1110 in FIG. 11. FIG. 16 illustrates this process. In the case of the first play mode, the decisions in S1601 and S1602 become NO and the flow advances to S1603. In this step S1603, an after touch process suitable for a keyboard instrument is executed. More specifically, the input after touch data is converted into a volume/timbre parameter of a musical tone based on the conversion curve (stored in the ROM 7 in FIG. 1) suitable for a keyboard instrument, and the parameter is sent to the tone generator 9 to change the characteristic of the tone generator.

Figure 17:
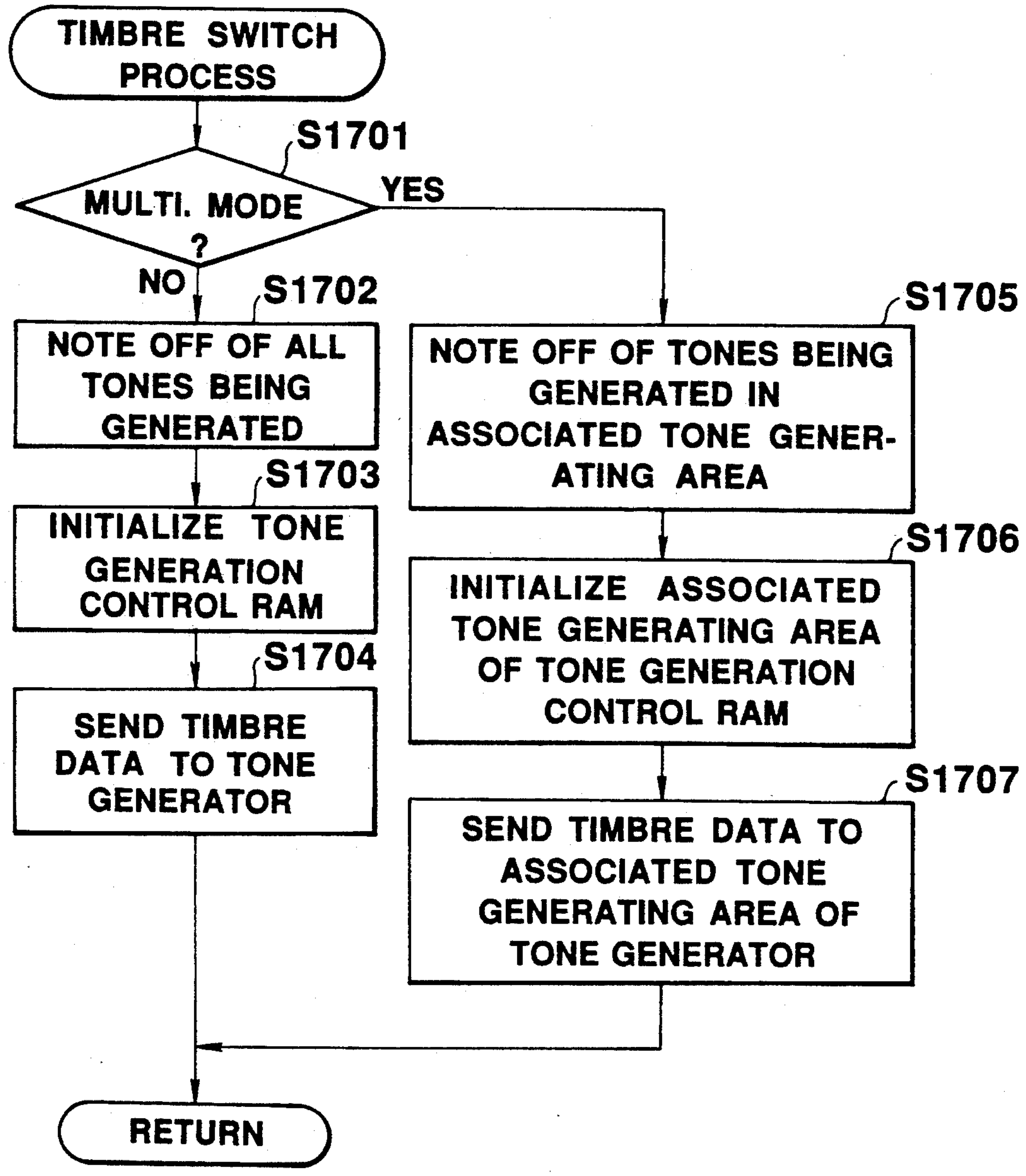
FIG. 17 is an operational flowchart for a timbre switching process.

If the timbre change command is input in the first play mode, after the decisions in S1101 to S1103 in FIG. 11 become NO, the decision in S1104 becomes YES and the channel discrimination 2 in S1111 will be executed. More specifically, as in the case involving the after touch command, only when the MIDI channel coincides with the fixed channel, the decision in S1301 in FIG. 13 becomes YES and the flow advances to the timbre change process in S1112 in FIG. 11. FIG. 17 illustrates this process. In the case of the first play mode, the decision in S1701 becomes NO and the flow advances to S1702 where all the musical tone presently being generated are set off. Subsequently, the note ON control RAM area in the RAM 8 (FIG. 1) is initialized in S1703 and the input timbre data is sent to the tone generator 9 to change the timbre to be generated in S1704.

A description will now be given of a case where the guitar mode in normal mode is selected as the second play mode.

If the note ON/OFF command is input in the second play mode, the decision in S1101 in FIG. 11 becomes YES and the channel discrimination 1 in S1105 will be executed. More specifically, after the decision in S1201 in FIG. 12 becomes NO and the decision in S1203 becomes YES, the discrimination in S1204 will be executed. Only when the MIDI channel is within 6 channels from the fixed channel to a channel higher by 5 from the fixed channel, the decision in S1204 becomes YES and the flow advances to S1106 in FIG. 11 or to the note ON/OFF process in FIG. 14. In the case of the second play mode, after the decision in S1401 becomes NO, the decision in S1402 becomes YES and the flow advances to S1409. If the input command is the note ON command, the flow advances to S1411 where when a note ON module assigned with the same channel as the MIDI channel in the tone generator 9 in FIG. 1, the module is subjected to note OFF. The channel discrimination is executed on the basis of channel data stored in the RAM 8 (FIG. 1) in S1413 to be described later. Then, an instruction to start note ON is given to an empty module of the tone generator in S1412. Further, the module which has started generating a musical tone and the MIDI channel are stored in the RAM 8 in S1413. The reason why new tone generation is started after musical tones in the same channel are set off is that MIDI channels for a command input from a string instrument such as a guitar are independently set for the individual strings so that a plurality of musical tones for the same string are never simultaneously generated. In order to leave some reverberation, the note OFF may be executed with a proper envelope being imparted.

If the input command is the note OFF command, the flow advances to S1410 where that of musical tones presently being generated by the tone generator 9 which has the same MIDI channel, is subjected to note OFF.

If the pitch bender command is input in the second play mode, after the decision in S1101 in FIG. 11 becomes NO, the decision in S1102 becomes YES and the channel discrimination 1 in S1107 will be executed. As in the case of the note ON/OFF command, after the decision in S1201 in FIG. 12 becomes NO, the decision in S1203 becomes YES, and only when the MIDI channel is within 6 channels from the fixed channel to a channel higher by 5 from the fixed channel, the decision in S1204 becomes YES and the flow advances to S1108 in FIG. 11 or to the pitch bender process in FIG. 15. In the case of the second play mode, after the decision in S1501 becomes NO, the decision in S1502 becomes YES and the flow advances to S1504. In this step, pitch bender data is reflected only on a tone corresponding to a previous note ON channel (tone-generating channel) which coincides with the MIDI channel. In other words, the pitch bend is given independently only to the musical tones corresponding to those strings to which choking has been done.

If the after touch command is input in the second play mode, after the decisions in S1101 and S1102 in FIG. 11 become NO, the decision in S1103 becomes YES and the channel discrimination 2 in S1109 or the process shown in FIG. 13 will be executed. As in the case where the after touch command is input in the first play mode, the decision in S1301 becomes YES only when the MIDI channel coincides with the fixed channel, and the flow then advances to the after touch process in S1110 in FIG. 11 or the after touch process in FIG. 16. More specifically, in second play mode, unlike in the case of the note ON/OFF command or pitch bender command, the present electronic musical instrument accepts the after touch command only when a predetermined, fixed MIDI channel which is the lowest one of the six channels is specified. As in the case of the first play mode, in the after touch process in FIG. 16, the flow advances from S1601 to S1602, then to S1603 so that the proper after touch process for a keyboard instrument is executed. In this case, the above command is executed simultaneously for six strings corresponding to those channels from the fixed channel to the one higher by 5 than this fixed channel. This can permit transfer of the after touch command to a single string to give the after touch effect simultaneously to the six strings.

If the timbre change command is input in the second play mode, after the decisions in S1101 to S1103 in FIG. 11 become NO, the decision in S1104 becomes YES and the channel discrimination 2 in S1111 or the process shown in FIG. 13 will be executed. More specifically, as in the case involving the after touch command, only when the MIDI channel coincides with the fixed channel or the lowest string channel, the decision in S1301 in FIG. 13 becomes YES and the flow advances to the timbre change process in S1112 in FIG. 11 or the process shown in FIG. 17. As in the case of the first play mode, the flow advances from S1701 to S1702 where all the musical tone presently being generated are set off. Subsequently, the tone generation control RAM area in the RAM 8 (FIG. 1) is initialized in S1703 and the input timbre data is sent to the tone generator 9 to change the timbre to be generated in S1704. In this case too, the same command is executed simultaneously for the channels for the six string corresponding to those channels from the fixed channel to the one higher by 5 than the fixed channel. Accordingly, sending the timbre change command to a single string can permit simultaneous timbre change for the six strings.

A description will now be given of a case where the wind mode in normal mode is selected as the third play mode.

The operation in a case where each of the note ON/OFF, pitch bender and timbre change is input in the third play mode is the same as that in a case where the first play mode or keyboard mode is selected.

If the after touch command is input in the third play mode, the flow advances from S1103 to S1109, then to S1110 in FIG. 11 as in the case of the first play mode. After the decision in S1601 in FIG. 16 become NO, the decision in S1602 becomes YES. The flow then advances to S1604 where the after touch process specific for a wind instrument will be executed. More specifically, the input after touch data is converted into a parameter of a tone volume/timbre based on the conversion curve or the conversion algorithm stored in the ROM 7 in FIG. 1, and the parameter is sent to the tone generator 9 to change the characteristic thereof. Accordingly, in a control mode specific to a wind instrument for controlling a volume by the after touch, it is possible to naturally cope with such a function that the after touch data always becomes small at the rising of a musical tone.

In combination mode which is the fourth play mode, as compared with the above-described normal mode, the same processes as done in the first to third play modes in normal mode will be executed in the individual operation flowcharts shown in FIGS. 11 to 17, except that two timbres are simultaneously generated and the poly number becomes 4 in combination mode. In this case, in guitar mode in combination mode, as the operation is performed with 4-tone poly for six strings for each timbre, tone generation control is executed while oldest musical tone data generated is being put off by a later-input note ON command.

Finally, a description will be given of the operation in a case where the multi poly mode is selected as the fifth play mode. In this case, the same operation as is done in the case of the first play mode will be performed, except that the individual processes are executed only for those tone generating areas to which the same channel as the MIDI channel is assigned. In this case, the tone generating areas are such regions which are assigned to behave as if independent instruments for the individual MIDI channels; for example, the first tone generating area has a channel no. 1 with 2-tone poly, the second tone generating area has a channel no. 2 with 3-tone poly, the third tone generating area has a channel no. 3 with 3-tone poly, and so forth.

If the note ON/OFF command is input in the fifth play mode, the flow advances from S1101 to S1105 in FIG. 11. The decision in S1201 in FIG. 12 becomes YES and the discrimination in S1202 is executed. The decision in this step becomes YES only when the poly number of the tone generating area assigned with the MIDI channel is not 0, then the flow advances to the note ON/OFF process in S1106 in FIG. 11 or the process shown in FIG. 14. Here, the decision in S1401 becomes YES and the processes in S1406 to S1408 corresponding to those in S1403 to S1405 in the first play mode will be executed only for those tone generating areas to which the MIDI channel is assigned.

If the pitch bender command is input in the fifth play mode, the flow advances from S1101 to S1102, then to S1107 in FIG. 11 and exactly the same channel discrimination 1 as done in the case of the note ON/OFF command is executed. The flow then advances to the pitch bender process in S1108 in FIG. 11 or the process shown in FIG. 15. Here, the decision in S1501 becomes YES and the process in S1505 corresponding to that in S1503 in the first play mode will be executed only for those tone generating areas to which the MIDI channel is assigned.

If the after touch command is input in the fifth play mode, the flow advances from S1101 to S1102, to S1103, then to S1109 in FIG. 11. The channel discrimination 2 in FIG. 13 is executed in the same manner as in the case of the first play mode. That is, the decision in S1301 becomes YES only when the MIDI channel coincides with the fixed channel of any of the tone generating areas, then the flow advances to the after touch process in S1110 in FIG. 11 or the process shown in FIG. 16. Here, the decision in S1601 becomes YES and the process in S1605 corresponding to that in S1603 in the first play mode will be executed only for those tone generating areas to which the MIDI channel is assigned.

If the timbre change command is input in the fifth play mode, the flow advances from S1101 to S1102, to S1103, to S1104 then to S1111 in FIG. 11 and exactly the same channel discrimination 2 as done in the case of the after touch command is executed. The flow then advances to the timbre change process in S1112 in FIG. 11 or the process shown in FIG. 17. Here, the decision in S1701 becomes YES and the processes in S1705 to S1707 corresponding to those in S1702 to S1704 in the first play mode will be executed only for those tone generating areas to which the MIDI channel is assigned.

As described above, when the normal mode, combination mode and multi poly mode are selected and, depending on whether an external electronic musical instrument coupled is a keyboard, an electronic guitar, an electronic wind instrument, or the like, the optimal tone generation control for each such external unit can be executed.

Operation for Control Data Change Process

Finally, the operation in a case where the control change command is input through the MIDI circuit 5 in FIG. 1 from an external unit will be described below referring to the operational flowchart shown in FIG. 18.

Figure 18:
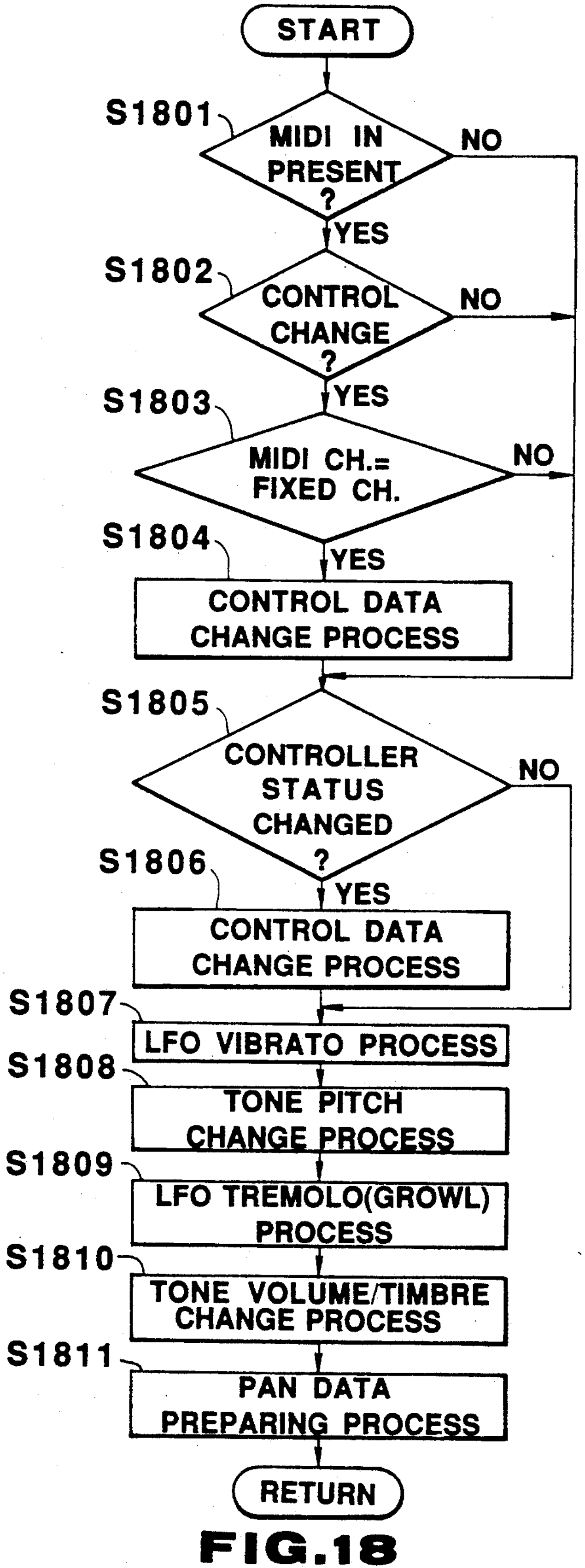
FIG. 18 is an operational flowchart executed when control data changes.

The operational flowchart shown in FIG. 18 is executed by priority over the general operational flowchart in FIG. 5 based on a periodic interrupt from a timer (not shown) in the CPU 1, as per the switch status fetching operation shown in FIG. 2. When the control change command is input, therefore, the process will be executed for each constant period mentioned.

When the control change command is input, the operation flowchart in FIG. 3 is executed based on an interrupt from the MIDI circuit 5 and the MIDI command received by the MIDI circuit 5 is fetched in the RAM 8, as already explained earlier. And this status is detected by the discrimination processes in S1801 and S1802 in FIG. 18. When no MIDI command has been input or the input MIDI command is not the control change command, the decision in S1801 or S1802 becomes NO and the flow advances to S1805 which will be described later.

When the control change command is detected, the decision in S1803 becomes YES only when the MIDI channel (MIDI channel specified by the same input command) coincides with the fixed channel, and the flow advances to S1804 where the control data change process is executed. In this process, a control associated with the input control change data is performed on the tone generator 9 in FIG. 1 based on the operation of the modulation wheel, foot volume, master volume, foot switch, portamento time change switch, portamento ON/OFF switch, or the like on an external unit. As explained in the section concerning the "MIDI IN process," in guitar mode (normal mode or combination mode), the above command is accepted only when the MIDI channel coincides with the fixed channel corresponding to the lowest string, and the actual control is simultaneously executed for those channels corresponding to six strings from the fixed channel to the one higher by 5 from the fixed channel. In multi poly mode the control is executed only for the associated tone generating areas when the MIDI channel coincides with any of the fixed channels corresponding to the individual tone generating areas.

As described above, in addition to the control change command input as a MIDI command, it is discriminated in S1805 whether or not the status of the controller 17 (FIG. 1) operated has changed from the status attained in the previous decision. As described in the section "Arrangement of First Embodiment," this process is executed in a case where this embodiment is realized as part of a keyboard instrument having the controller 17. As the operation of its own controller is reflected on tone generation control, a change in status of the controller 17 is judged in S1805.

If the controller has been operated, the associated control data change process will be executed in S1806. This process is the same as the process in S1804. If this embodiment is realized as an electronic musical instrument of a tone generator module type having no controller 17, the processes in S1805 and S1806 need not be executed.

In the subsequent step S1807, data for realizing the LFO vibrato is computed. The LFO vibrato is an effect to periodically modulate the pitch of a musical tone at a low frequency by the output of a LFO (low frequency oscillator) and is realized by preparing the associated pitch change data and sending it to the tone generator 9 under the control of the CPU 1 (FIG. 1). The process executed in S1807 includes data computation for modulating the LFO vibrato by the control data computed in the aforementioned S1804 or S1806 based on the MIDI command or the operation of the controller 17.

In the subsequent step S1808, a command for changing the pitch of a musical tone is actually given to the tone generator 9 based on the LFO vibrato data computed in the above process.

In S1809, data for realizing the LFO tremolo (growl) is computed. This is an effect to periodically modulate the volume/timbre of a musical tone at a low frequency by the output of the LFO and is realized by preparing the associated volume or timbre change data and sending it to the tone generator 9 under the control of the CPU 1 (FIG. 1). The process executed in S1809 includes data computation for modulating the LFO tremolo (growl) by the control data computed in the aforementioned S1804 or S1806 based on the MIDI command or the operation of the controller 17. This operation will be described in detail in a later section "Operation of LFO Vibrato Process."

In the subsequent step S1810, a command for changing the volume/timbre of a musical tone is actually given to the tone generator 9 based on the LFO tremolo (growl) data computed in the above process.

In S1811, data for causing a panning effect is computed. As already described earlier, this is an effect for automatically changing the localization of the right and left channels which is imparted to stereo analog tone signals from the D/A converter 10 by the panning effect generator 11.

Figure 19:
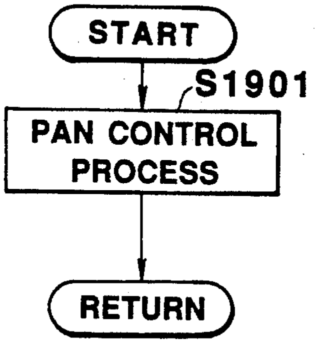
FIG. 19 is an operational flowchart for a pan control process.

The actual panning effect is produced and imparted as the CPU 1 (FIG. 1) outputs a control signal to the panning effect generator 9 via the bus 2 in the process in S1901 of the operational flowchart shown in FIG. 19 which is executed by a timer interruption periodically occurring at a given period different from that involved in the operational flowchart shown in FIG. 18.

Operation of LFO Vibrato Process

A characterizing process of this embodiment is such that, as described in the section "Summary of Tone Generation Modes of the Embodiment," the LFO vibrato effect, particularly, the delay vibrato effect, is imparted to a note-ON musical tone, in which case different operations are performed depending on whether or not the guitar mode is selected. The following presents a detailed description thereof.

The LFO vibrato process is carried out at the time the note ON/OFF process in FIG. 14 is executed (corresponding to S505 in FIG. 5 and S1106 in FIG. 11) and the control data change process in FIG. 18 is executed.

Figure 20:
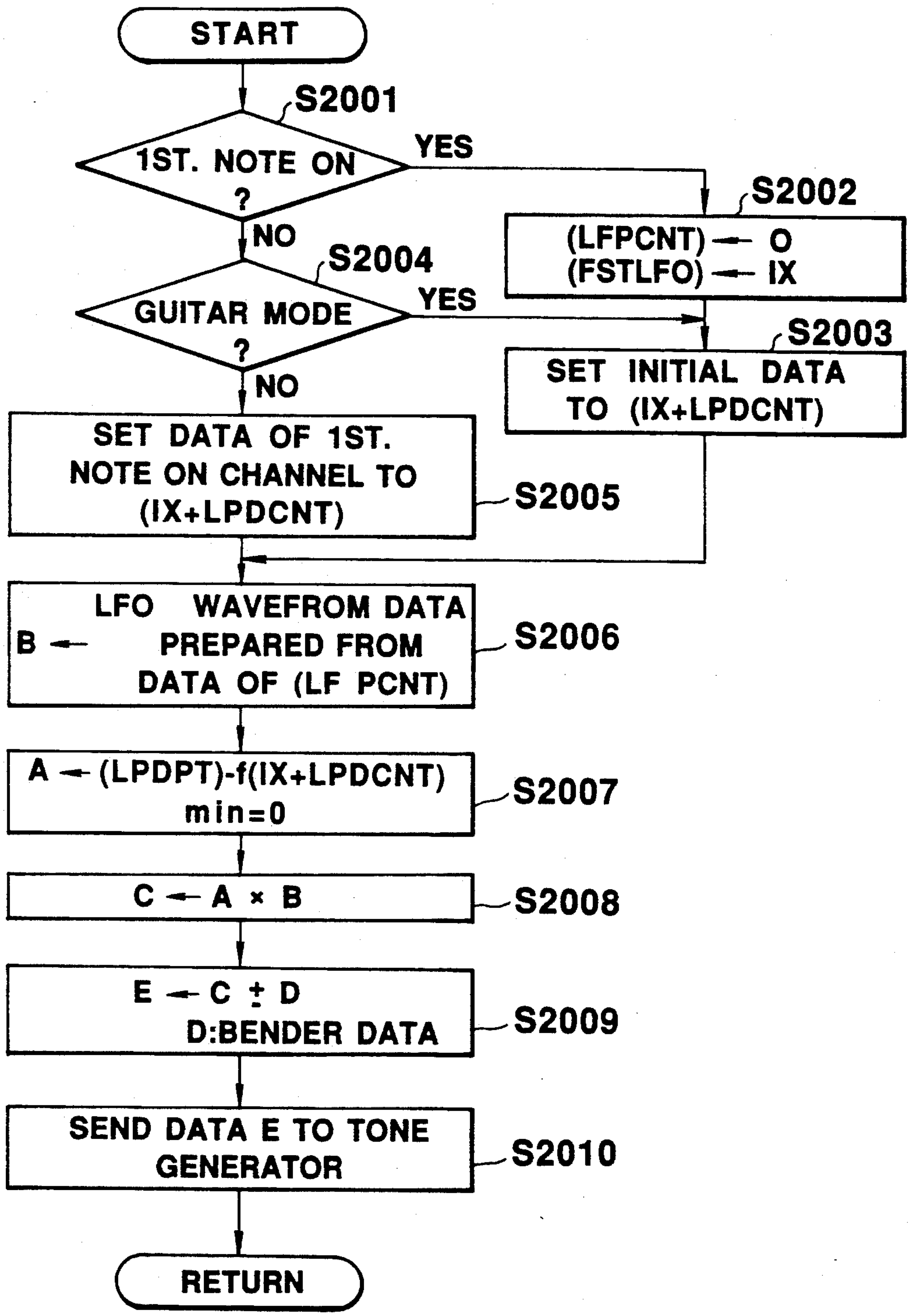
FIG. 20 is an operational flowchart for an LFO vibrato process for an attack portion.

At the time of executing the note ON/OFF process, the operational flowchart in FIG. 20 is executed on the module of the tone generator 9 that should be set note ON. This process is carried out together with the aforementioned process in S1412 in FIG. 14 when the guitar mode is selected in normal mode (the second play mode) or the guitar mode is selected in combination mode (part of the fourth play mode). Further, the process for imparting the LFO vibrato effect is carried out together with the process of S1404 in FIG. 14 when the guitar mode is not selected in normal mode or in combination mode. The LFO effect imparting process is carried out together with the process of S1407 in FIG. 14 when the multi poly mode is selected (in which case only the keyboard mode inevitably becomes active and the guitar mode will not be selected).

Figure 21:
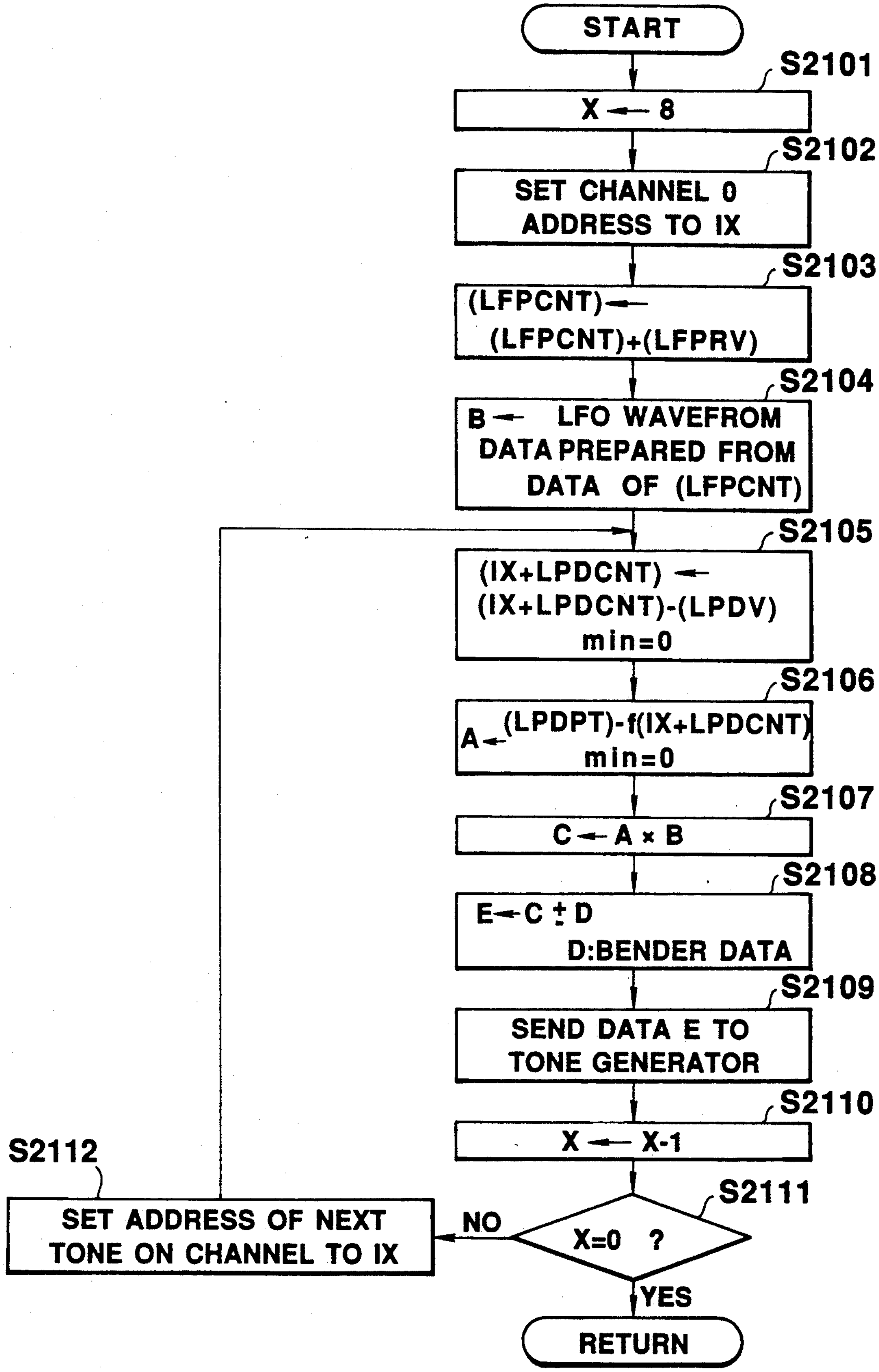
FIG. 21 is an operational flowchart for a timer interrupt LFO vibrato process.

At the time the control data change process is executed, the operational flowchart shown in FIG. 21 is repeatedly executed with respect to all the eight modules of the tone generator 9 (FIG. 1). This repetitive operation is performed by executing S2112 and S2105 to S2109 until the variable X set to 8 in S2101 (FIG. 21) and being decremented by in S2110 is detected to be 0 in S2111. Since the processes of S2103 and S2104 are common to eight modules, they are executed only once at the beginning. This will be described later.

First, a description will be given of a case when note ON of the first musical tone is initiated (1st note ON) in a state where all the musical tones are rendered note OFF. In the case of the 1st note ON, the same operation is carried out irrespective of whether or not the guitar mode is selected.

At the time of the 1st note ON, the decision in S2001 in FIG. 20 becomes YES and the flow advances to S2002. In the LFO vibrato process, an input value which increases with time is converted to prepare LFO waveform data in accordance with a sine function, a triangular wave function, a sawtooth wave function or the like. The input value in this case is given as a counter value to be stored at an address LFPCNT in the RAM 8 in FIG. 1; this counter value is called an LFO counter value (LFPCNT). In S2002, this LFO counter value (LFPCNT) is commonly used by the eight modules in the RAM 8 (FIG. 1). At the same time, head address IX of the work area of those set in the RAM8 corresponding to the individual modules, which corresponds to the note ON start module or the module invoked at the time of the 1st note ON, is set at an address FSTLFO in the RAM 8. This function will be described later. It should be understood that the head address of the work area corresponding to the note ON start module at that time is set in advance in IX.

Then, a counter value, which decreases with time and controls the delay characteristic of an LFO effect (see FIG. 22A, for example), is stored at a relative address LPDCNT in the work area corresponding to each module in the RAM 8. This counter value corresponding to the present note ON start module exists at an absolute address IX+LPDCNT; this counter value is called a delay counter value (IX+LPDCNT). After executing the aforementioned process of S2002, initial data is set as a delay counter value (IX+LPDCNT) corresponding to the 1st note ON module in S2003.

In the subsequent step S2006, the LFO counter value (LFPCNT) is converted to prepare LFO waveform data in accordance with the sine function or the like and is set in a register B in the CPU 1. The register B may be a register incorporated in the CPU 1 or a specific memory area in the RAM 8. The same can apply to registers A, C, D and E.

At the address LPDPT in the RAM 8 (FIG. 1), data for determining the time length of the delay characteristic of an LFO effect is stored; this data is called delay depth data (LPDPT). This data is commonly used by the eight modules in the RAM 8. In S2007, a value obtained by converting the delay counter value (IX+LPDCNT) corresponding to the note ON start module using a given function f is subtracted from the delay depth data (LPDPT), thus acquiring an envelope value having an modulation width of the delay characteristic of the LFO effect corresponding to the module. The envelope value is set in the register A. As is evident from the waveforms in FIGS. 22A and 22B which are associated with the 1st note ON, the envelope value is at the minimum value 0 at the 1st note ON, then gradually increases to the same constant value as the delay depth data (LPDPT) at the end of the delay; the final level is the modulation width (amplitude) of the LFO vibrato for a constant portion. In this case, since the delay counter value (IX+LPDCNT) decreases with time in S2105 in FIG. 21 (which will be described later), the function f should have such a characteristic that with respect to the delay counter value (IX+LPDCNT) as an input, a function value as an output equals the delay depth data (LPDPT) at the initial state, then gently decreases to 0.

The envelope data in the register A computed in S2007 is multiplied by the LFO waveform data set in the register B and the LFO waveform data is imparted with an envelope (i.e., a delay characteristic) and the resultant value is set in the register C in S2008.

In the subsequent step S2009, the value of the register C is subjected to addition/subtraction with bender data set in advance in the register D and the resultant data is set in the register E. The bender data is control data computed in the above-described S1804 or S1806 in FIG. 18 based on the MIDI command or the operation of the controller 17 (see FIG. 1).

The LFO vibrato data produced by the above process is sent to the tone generator 9 shown in FIG. 1 in S2010. As a result, the pitch of a musical tone for the 1st note ON module is changed and the LFO vibrato effect is imparted thereto in the tone generator 9.

As described above, after the 1st note ON operation is executed, the LFO vibrato process in FIG. 21 corresponding to S1807 is executed every time the control data change process (FIG. 18) is periodically initiated by the timer interruption, and the LFO vibrato effect is imparted at the aforementioned constant period in the tone pitch change process of S1808. The following is a description relating to FIG. 21.

At an address LFPRV in the RAM 8 (FIG. 1), data for updating the LFO counter value (LFPCNT) is stored; this data is called LFO update data (LFPRV). In S2103, the LFO update data (LFPRV) is imparted to the LFO counter value (LFPCNT) to be new LFO counter value (LFPCNT), thus updating the counter value. Since this counter value is used commonly for the eight modules in the tone generator 9, the process of S2103 is executed once every time the process of S1807 in FIG. 18 is executed.

In S2104, as in S2006 in FIG. 20, LFO waveform data is prepared from the LFO counter value (LFPCNT) and is set in the register B. Since this counter value is also used commonly for the eight modules in the tone generator 9, the process of S2104 is executed once every time the process of S1807 (FIG. 18) is executed.

Since the sequence of processes of S2105 to S2109 is executed for each of the eight modules of the tone generator 9 by the repetitive control process of S2101, S2102, S2110 and S2111, as described above, the process associated with the 1st note ON musical tone is also executed once as one process of the repetition.

At an address LPDV in the RAM 8 (FIG. 1), data for updating the delay counter value (IX+LPDCNT) is stored; this data is called delay update data (LPDV). In S2105, the delay update data (LPDV) is subtracted from the delay counter value (IX+LPDCNT) corresponding to the 1st note ON module to be new delay update value (IX+LPDCNT), thus updating this counter value. The minimum value of the counter value is controlled not to be smaller than 0.

In S2106, as in S2007 in FIG. 20, an envelope value with the amplitude of the delay characteristic of the LFO effect corresponding to the 1st note ON is computed by subtracting, from the delay depth data (LPDPT), a value obtained by converting the delay counter value (IX+LPDCNT) corresponding to the 1st note ON using a given function f, and the resultant value is set in the register A.

Figure 22B:
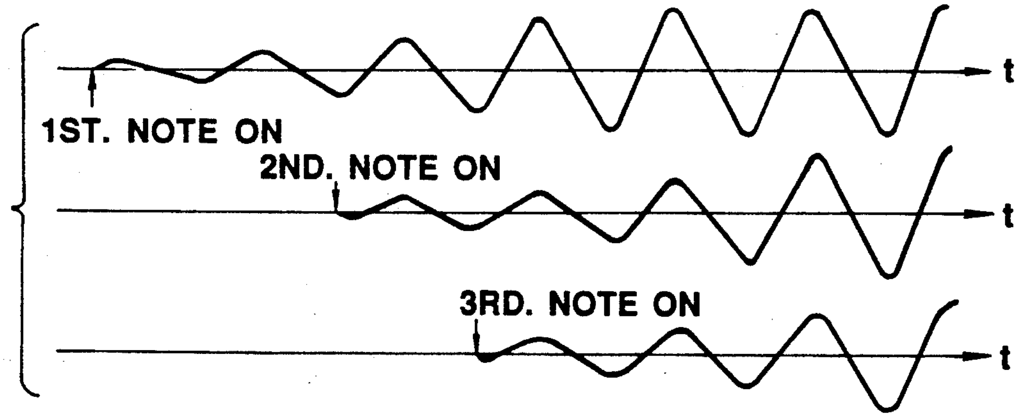

The same processes of S2008 to S2010 in FIG. 20 are executed in S2107 to S2109, and the resultant LFO vibrato data is sent to the tone generator 9 in FIG. 1. In the tone pitch change process of S1808 in FIG. 18, the pitch of a musical tone for the 1st note ON module of the tone generator 9 is changed and the LFO vibrato effect is imparted to the musical tone. Pitch alteration is sequentially executed in the tone generator 9 by repeating such a process at a given period, and the LFO vibrato effect as shown in FIG. 22A or 22B is imparted to the 1st note ON musical tone. Since the operation of FIG. 21 needs to be executed for a note ON tone generator module (note ON channel), it is possible to judge the status of each tone generator module and execute the sequence of processes S2103 to S2109 only for the necessary tone generator modules in order to shorten the actual processing time.

A description will now be given of a case where note ON of the second musical tone, third musical tone and so forth (hereinafter referred to as 2nd note ON, 3rd note ON, . . . ) has occurred following the 1st note ON. In this case, different operations will be performed depending on whether or not the guitar mode is selected.

To begin with, a description will be given of a case where the guitar mode is selected for the 2nd note ON, 3rd note ON, and so forth.

In this case, after the decision in S2001 in FIG. 20 becomes NO, the decision in S2004 becomes YES and the flow advances to S2003.

In S2003, initial data is set as a delay counter value (IX+LPDCNT) independently corresponding to that module which has started tone generation.

Although the LFO waveform data produced in S2006 is common to the one corresponding to the 1st note ON, the envelope value produced in S2007 is prepared from the delay counter value (IX+LPDCNT) independently associated with each note ON start module such as the 2nd note ON, 3rd note ON or the like.

The LFO vibrato characteristic, particularly, the delay characteristic, which is started to be imparted to each note ON start module of the tone generator 9 in the subsequent processes of S2008 to S2010, is such that the modulation width or the amplitude gradually increases from 0, as shown in FIG. 22B, independently for each of 1st note ON, 2nd note ON, 3rd note ON and so forth.

Further, in the LFO vibrato process executed at a constant period in S1807 in the control data change process shown in FIG. 18, the processes of S2104 to S2109 are repeated for each of the eight modules of the tone generator 9.

In this case, for each repetition, the head address IX of the work area corresponding to each module is set in S2112, the delay counter value (IX+LPDCNT) is updated independently for each module, and envelope values independently corresponding to the 1st note ON, 2nd note ON, 3rd note ON and so forth are prepared based on the updating in S2106.

Accordingly, the LFO vibrato data to be sent to the individual note ON modules of the tone generator 9 become independent for the respective modules through the subsequent processes S2107 to S2109, and the LFO vibrato characteristic, particularly, the delay characteristic, imparted to each note ON module in the tone pitch change process of S1808 in FIG. 18 becomes independent for each of the 1st note ON, 2nd note ON, 3rd note ON and so forth, as shown in FIG. 22B.

A description will now be given of a case where the guitar mode is not selected for the 2nd note ON, 3rd note ON, and so forth.

In this case, after the decision in S2001 in FIG. 20 becomes NO, the decision in S2004 becomes NO and the flow advances to S2005.

In S2005, a counter value corresponding to the module which has already rendered to be 1st note ON, is set as a delay counter value (IX+LPDCNT) independently corresponding to that module which has started tone generation. Although this counter value is stored in the relative address LPDCNT of the work area in the RAM 8 corresponding to the 1st note ON module (see S2003), the head address of the work area for the 1st note ON is stored at the FSTLFO in the RAM 8 in the above-described process of S2002. Therefore, the counter value can be attained by loading, as the delay counter value (IX+LPDCNT), a value stored at the absolute address obtained by imparting the relative address value LPDCNT to the address value stored at the address FSTLFO. This process permits the delay counter value (IX+LPDCNT) corresponding to each note ON start module for the 2nd note ON, 3rd note ON, etc., to change in synchronism with the one involved at the time of the 1st note ON in the following operation.

Therefore, the envelope values produced in S2007, which correspond to the individual note ON start modules for the 2nd note ON, 3rd note ON, etc., all become coincident with the one corresponding to the note ON start module for the 1st note ON.

Consequently, the LFO vibrato characteristic, particularly, the delay characteristic, which is started to be imparted to each note ON start module of the tone generator 9 in the subsequent processes of S2008 to S2010, is such that the modulation widths or the amplitudes for the 2nd note ON, 3rd note ON and so forth all increase from the amplitude synchronized with that of the 1st note ON, as shown in FIG. 22A.

Further, in the LFO vibrato process executed at a constant period in S1807 in the control data change process shown in FIG. 18, even when the processes of S2104 to S2109 are repeated for the individual eight modules of the tone generator 9, the delay counter value (IX+LPDCNT) for each module is updated in synchronism with that of the 1st note ON module in S2105. Therefore, the LFO vibrato data to be sent to the individual note ON modules of the tone generator 9 becomes the same as that of the 1st note ON module in the processes of S2106 to S2109, and the LFO vibrato characteristic, particularly, the delay characteristic, imparted to the individual note ON modules in the subsequent tone pitch change process of S1808 (FIG. 18) is such that the 2nd note ON, 3rd note ON and so forth are all synchronized with the 1st note ON as shown in FIG. 22A.

As described above, according to this embodiment, even in different cases where the guitar mode is selected and where it is not selected, the LFO vibrato (delay vibrato) effect can be imparted in such a way that the optimal vibrato effect is given to a tone waveform in either mode.

Although alteration of a play mode is done by operating each switch (shown in FIG. 7) of the switch section 3 (FIG. 1) in the above embodiment, the alteration may be performed by a MIDI command supplied from an external unit.

Although the number of the simultaneously generatable musical tones permitted is set to 8 in the above embodiment, it may be increased to 16, 24, 32 and so forth. Further, the number of available strings in guitar mode, which is set to 6 in the above embodiment, may also be increased.

In addition, more than two tone generating areas may be provided in combination mode so that three or more musical tones with different timbres can be simultaneously generated for one note ON. Further, the number of tone generating areas may be selected from 2, 4, 8 and so forth. In this case the number of simultaneously generatable poly tones also changes.

Although the keyboard mode alone is fixedly set in multi poly mode, a modification may be made to permit the guitar mode, wind mode or the like to be also set.

According to this invention, an arbitrary combination of play modes can be realized as long as a plurality of play modes can be switched by one electronic musical instrument.

The above-described embodiment permits selection of whether or not to impart a delay characteristic independently to musical tones for each note ON in the delay accompanying LFO vibrato process, depending on whether the guitar mode is selected or not. The same feature may also be applied to the LFO tremolo (growl) process, etc. in the control data change process shown in FIG. 18.

Although only the delay characteristic is given independently for the individual modules and the LFO counter value (LFPCNT) is set common to these modules according to the above embodiment, the latter parameter may also be controlled independently for the modules. Similarly, the delay depth data (LPDPT) (see S2007 in FIG. 20), LFO update data (LFPRV) (see S2103 in FIG. 21) and the delay update data (LPDV) (see S2105 in FIG. 21) may be set independently for the individual modules.

As is evident from the foregoing description, the arrangement of this embodiment permits a low frequency modulation effect accompanied by the proper delay characteristic to be imparted to musical tones in accordance with a selected musical operation mode.

More specifically, when a tone generation mode for executing tone generation control based on the musical operation of an electronic guitar, for example, an LFO effect having a delay characteristic is imparted in such a manner that the width of the oscillation or the amplitude of the same effect gradually increases from zero in a given time independently from the note ON start time for each tone signal and becomes a given amplitude thereafter. This feature can allow an LFO effect accompanying the optimal delay characteristic to be imparted to musical tones without impairing a musical expression for each string on an electronic guitar, for example.

In addition, if a tone generation mode for controlling tone generation based on a musical operation other than the one involved in an electronic guitar, for example, is selected, an LFO effect, such as the LFO vibrato, accompanied by the delay characteristic is imparted in such a manner that, with respect to the tone signal whose tone generation starts first in a note OFF state, the oscillation width of this effect gradually increases from 0 in a given time from the note ON start time of the tone signal, then becomes a constant oscillation level thereafter, and those tone signals whose tone generation follows that of the first note ON tone signal are given with an effect synchronized with the LFO effect imparted to the first note ON tone signal. This feature can allow tone signals to be given with an LFO effect accompanied by a delay characteristic suitable for other electronic musical instruments than the electronic guitar, such as a keyboard instrument and a wind instrument.

Second Embodiment

The second embodiment of the present invention will be described below. A description of those portions of this embodiment which are identical to those of the first embodiment will be omitted.

According to the second embodiment, when the combination mode (fourth play mode) in the first embodiment is selected, two play modes can be selected: total ON and total OFF. More specifically, in generating two timbres simultaneously in combination mode, setting on a total ON key 22 shown in FIG. 23 sets the total ON mode in which the LFO vibrato effect is synchronously imparted to the simultaneously-generated two timbres. This feature allows a natural LFO vibrato effect to be given to the simultaneously-generated two timbres. In a case where an operation other than the simultaneous generation of two timbres is performed, setting off the total ON key 22 sets the total OFF mode in which the LFO vibrato effect can be imparted independently to individual musical tones. In a mode other than the combination mode, however, the LFO vibrato effect can be automatically and independently given to individual musical tones. It should be noted that those keys in FIG. 23 other than the total ON key have the same functions as those of FIG. 7 explained in the foregoing description of the first embodiment.

In short, the feature of the second embodiment lies in that in different cases where the total ON is selected in combination mode, the total OFF is selected in the same mode, the guitar mode is selected and the guitar mode is unselected both irrespective of the former two cases, the LFO vibrato (delay vibrato) effect can be imparted so that the optimal vibrato effect is given to a tone waveform in each mode.

Figure 24A:
FIGS. 24A to 24I are diagrams illustrating display examples for the individual modes.
Figure 24B:
Figure 24C:
Figure 24D:
Figure 24E:
Figure 24F:
Figure 24G:
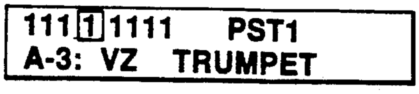

FIGS. 24A through 24I illustrate display states of the second embodiment; those in FIGS. 24A to 24C concerning the normal mode and those in FIGS. 24D to 24F concerning the combination mode and the one in FIG. 24G concerning the multi poly mode are same as those in the first embodiment.

Figure 23:
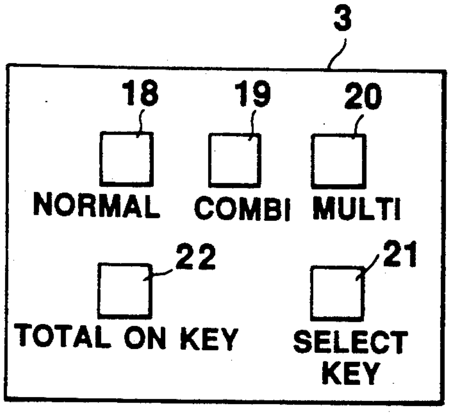
FIG. 23 is a diagram illustrating the structure of tone generation mode setting key switches according the second embodiment of the present invention.
Figure 24H:
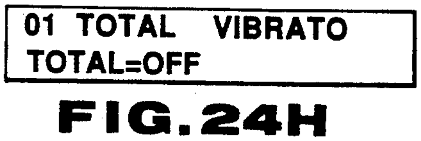
Figure 24I:

With the combination mode shown in FIGS. 24D–24F being selected, when the total ON key 22 in FIG. 23 is depressed, the display changes to what is shown in FIG. 24H or 24I. Depressing a select key 21 in this state switches the display between those shown in FIGS. 24H and 24I, so that the total ON state and total OFF state can be selected in combination mode. The first line on the display in FIG. 24H or 24I indicates that the setting is done for the LFO vibrato process.

Figure 25B:
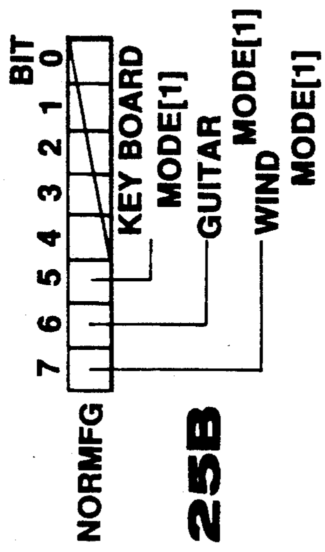
FIGS. 25A to 25C are diagrams illustrating the configuration of a tone generation mode memory.
Figure 25C:
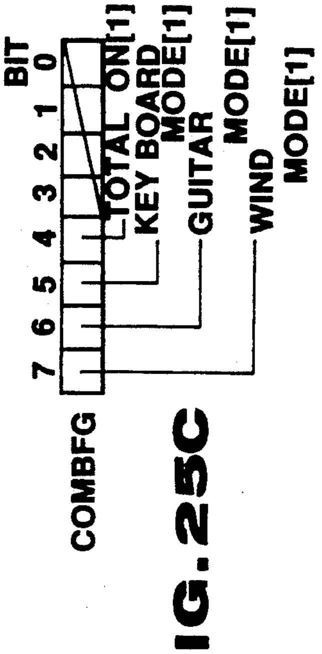
Figure 25A:
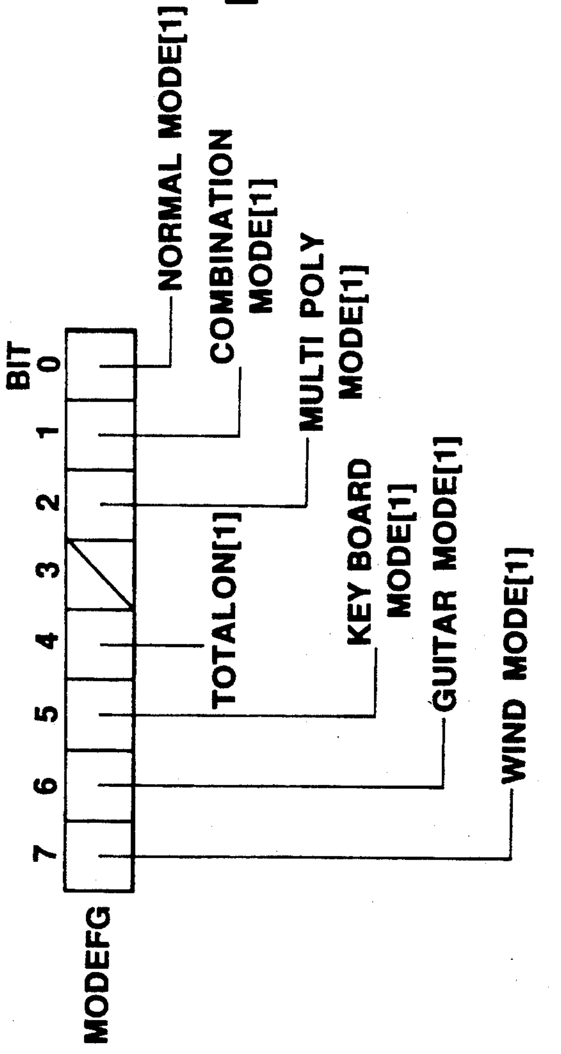

According to the second embodiment, processes similar to those executed in the first embodiment are carried out under the control of the CPU 1, the mode flag used at this time would be as shown in FIGS. 25A to 25C. The second embodiment differs from the first one in bit 4 (FIG. 25A) of the flag MODEFG and bit 4 (FIG. 25C) of the flag COMBFG.

Depressing a switch 19 in FIG. 23 for setting the combination mode advances the flow from S903 to S908 in FIG. 9 where the combination mode setting process is executed. In this process, all the musical tones being generated by the tone generator 9 (FIG. 1) are set off and the flag COMBFG shown in FIG. 25C, which is an exclusive RAM (part of the RAM 8 in FIG. 1) exclusively used for the combination mode, is read out to judge if it is the keyboard mode, guitar more or wind mode, or if it is the total ON mode or total OFF mode in combination mode. As shown in FIG. 25C, bits 5 to 7 of this flag COMBFG are exactly the same as those of the flag NORMFG shown in FIG. 25A; bit 4 indicates the total ON mode when it is "1" and indicates the total OFF mode when it is "0." After executing the discrimination, data is set to the flag MODEFG shown in FIG. 25A. Bit 4 of the flag MODEFG indicates the total ON mode when it is "1" and indicates the total OFF mode when it is "0." After the data setting, the memory areas (not particularly shown) on the RAM 8 (FIG. 1) necessary for tone generation control are all initialized in order to perform the operation in combination mode, as already described with reference to FIG. 6.

If the select key 21 in FIG. 23 is depressed after depressing of the total ON key 22 in FIG. 23, the flow advances from S905 to S910 in FIG. 9 for execution of the K, G and W change process. This process is valid only in combination mode; when bit 4 of the flag COMBFG (FIG. 25C) is "0," it is set to "1" or when this bit is "1," it is set to "0" before the same combination mode setting process as done in S908 is executed.

Operation of LFO Vibrato Process

The characterizing process of this second embodiment is to impart the LFO vibrato effect, particularly, the delay vibrato effect, to note ON musical tones. Different operations will be executed in different cases where the total ON is selected in combination mode, the total OFF is selected in the same mode, the guitar mode is selected and the guitar mode is unselected both irrespective of the former two cases.

The LFO vibrato process is carried out at the time the note ON/OFF process in FIG. 14 is executed (corresponding to S505 in FIG. 5 and S1106 in FIG. 11) and the control data change process in FIG. 18 is executed.

Figure 26:
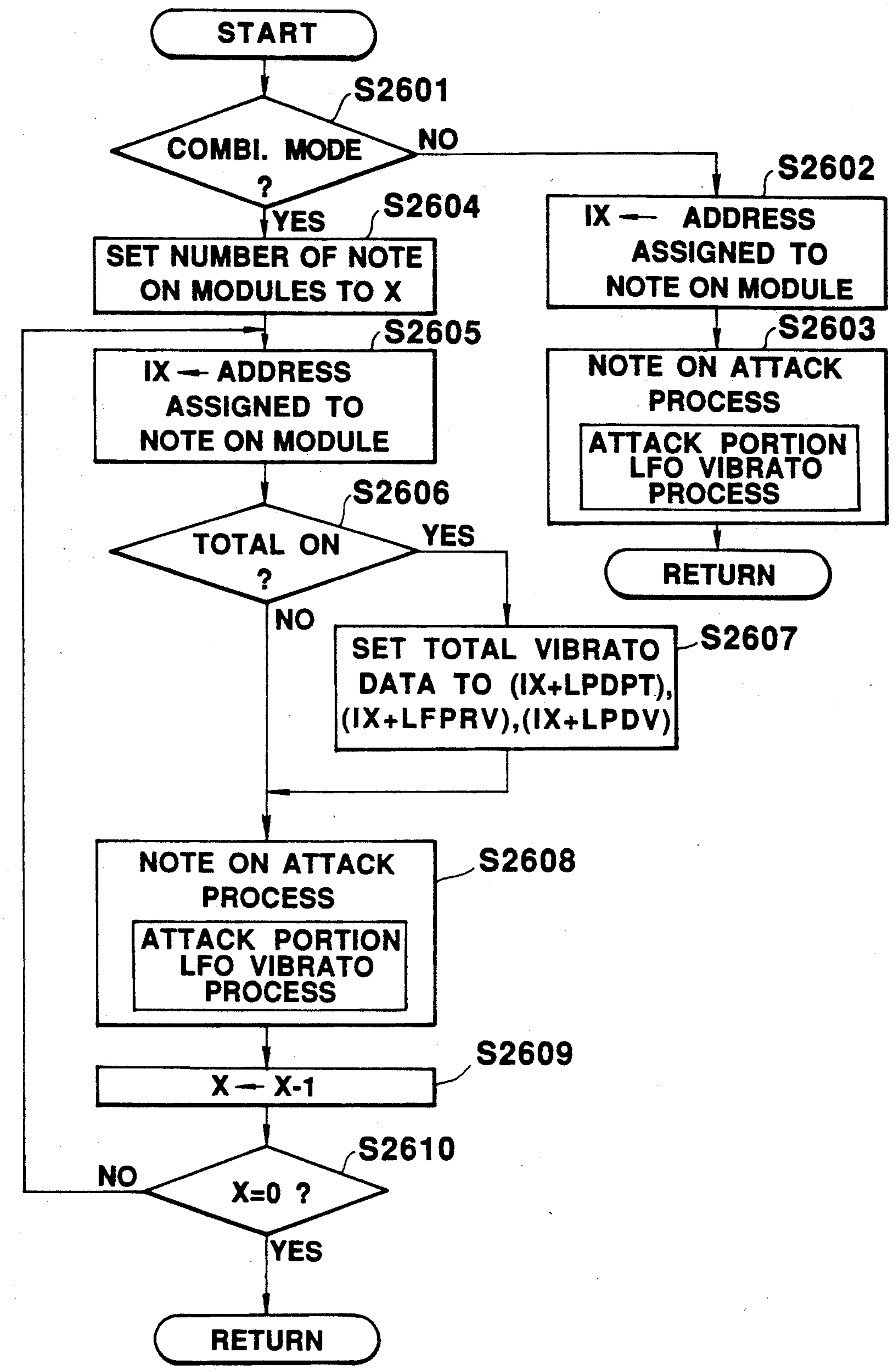
FIG. 26 is an operational flowchart for an attack process according to the second embodiment.
Figure 27:
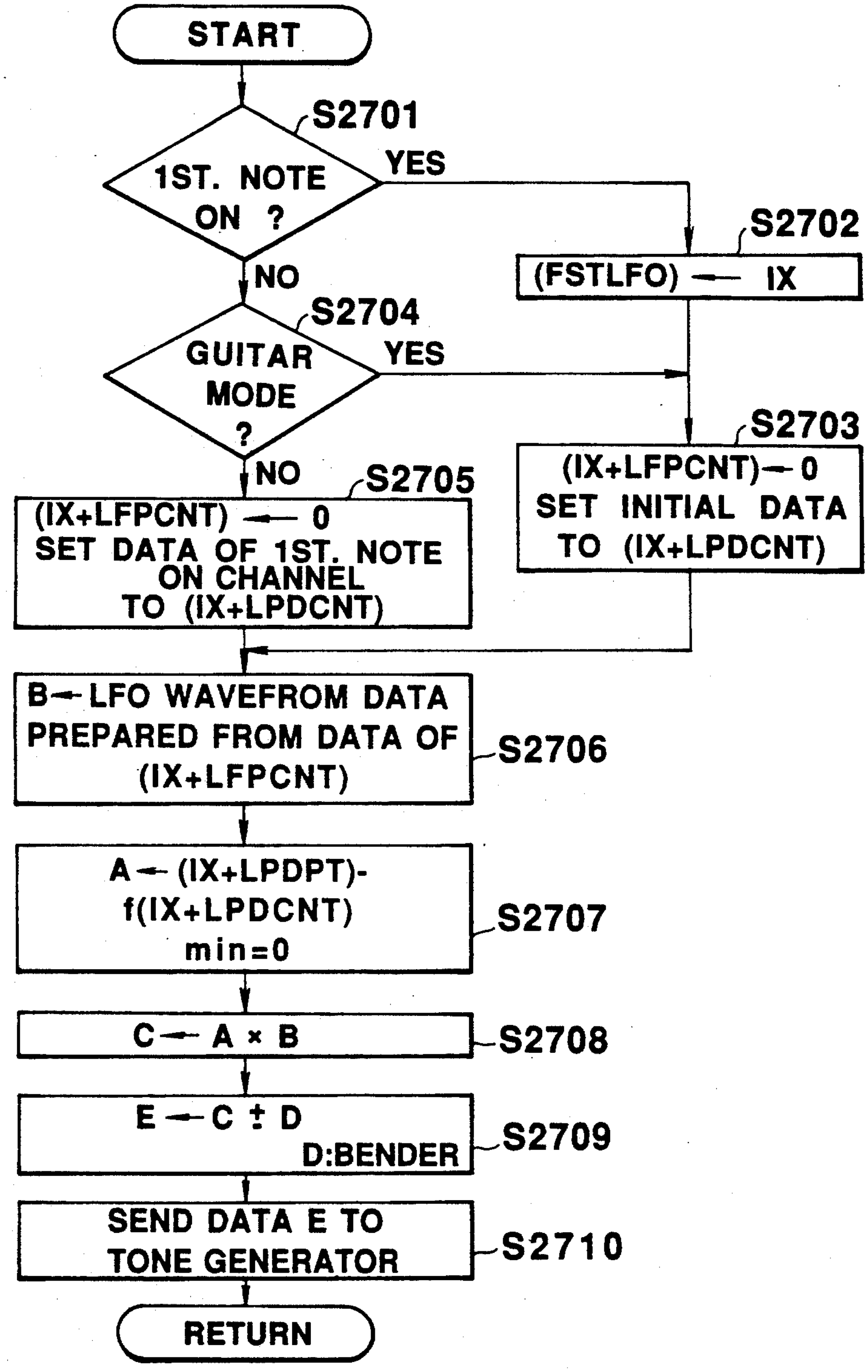
FIG. 27 is an operational flowchart for an LFO vibrato process for an attack portion.

At the time of executing the note ON/OFF process, the operational flowcharts in FIGS. 26 and 27 are executed on the module of the tone generator 9 of FIG. 1 that should be set note ON. This process is carried out together with the aforementioned process in S1412 in FIG. 14 when the guitar mode is selected in normal mode (the second play mode) or the guitar mode is selected in combination mode (part of the fourth play mode). Further, the process for imparting the LFO vibrato effect is carried out together with the process of S1404 in FIG. 14 when the guitar mode is not selected in normal mode or in combination mode. The LFO effect imparting process is carried out together with the process of S1407 in FIG. 14 when the multi poly mode is selected (in which case only the keyboard mode inevitably becomes active).

At the time the control data change process is executed, the operational flowchart shown in FIG. 27 is repeatedly executed with respect to all the eight modules of the tone generator 9 (FIG. 1). This repetitive operation is performed by executing S2812 and S2803 to S2809 until the variable X set to 8 in S2801 (FIG. 28) and being decremented by 1 in S2810 is detected to be 0 in S2811.

The following describes (1) the operation for 1st note ON in a mode other than the combination mode, (2) the operation for any note ON following the 1st note ON (2nd note ON, third note ON and so forth) in guitar mode selected in other mode than the combination mode, (3) the same operation as in (2) but the guitar mode is not selected, (4) the operation for the total OFF mode in combination mode, and (5) the operation for the total ON mode in combination mode, in the named order.

First, a description will be given of the case (1) where the operation in other play mode than the combination mode is performed. In this case, the LFO vibrato effect is imparted automatically and independently to individual musical tones, and different operations for imparting the delay characteristic can be performed depending on whether or not the guitar mode is selected.

First, a description will be given in a case when note ON of the first musical tone is initiated (1st note ON) in a state where all the musical tones are rendered note OFF. In the case of the 1st note ON, the same operation is carried out irrespective of whether or not the guitar mode is selected.

As the combination mode is not selected, the decision in S2601 in FIG. 26 becomes NO, and the flow advances to S2602. In this step, the head address of a work area in the RAM 8 (FIG. 1) corresponding to a note ON start module (the module at the time of 1st note ON in this case) is set as the head address IX in S2602.

The flow then advances to S2603 where the note ON attack process is executed. In this process, the process for each note ON start as described with reference to FIG. 14 is performed; of the process, the operational flowchart concerning the LFO vibrato process is illustrated in detail in FIG. 27.

Referring to FIG. 27, as it is the 1st note ON, the decision in S2701 in FIG. 27 becomes YES and the flow advances to S2702. In this step, the head address IX of that of the work areas in the RAM 8 (FIG. 1) of the individual modules which corresponds to the aforementioned note ON start module or the 1st note ON module, is set in an address FSTLFO in the RAM 8. This will be described later.

The flow then advances to S2703. In the LFO vibrato process, an input value which increases with time is converted to prepare LFO waveform data in accordance with a sine function, a triangular wave function, a sawtooth wave function or the like. The input value in this case is given as a counter value to be stored at a relative address LFPCNT in the RAM 8 of the work area corresponding to each module. As IX is the head address of the work area corresponding to the present note ON start module (1st note ON module), this counter value corresponding to the present note ON start module exists at an absolute address IX+LFPCNT; this counter value is called an LFO counter value (IX+LFPCNT). In S2703 the LFO counter value (IX+LFPCNT) of the 1st note ON module is initialized to be 0.

Further, a counter value, which decreases with time and controls the delay characteristic of an LFO effect (see FIG. 22A, for example), is stored at a relative address LPDCNT in the work area corresponding to each module in the RAM 8. This counter value corresponding to the present note ON start module exists at an absolute address IX+LPDCNT; this counter value is called a delay counter value (IX+LPDCNT). In S2703, initial data is set as a delay counter value (IX+LPDCNT) corresponding to the 1st note ON module in addition to the aforementioned initialization of the LFO counter value (IX+LFPCNT).

In the subsequent step S2706, the LFO counter value (IX+LFPCNT) for the 1st note ON module is converted to prepare LFO waveform data in accordance with the sine function or the like and is set in a register B in the CPU 1. The register B may be a register incorporated in the CPU 1 or a specific memory area in the RAM 8. The same can apply to registers A, C, D and E which will be mentioned later.

At the relative address LPDPT in the RAM 8 (FIG. 1) of the work area corresponding to each module, data for determining the time length of the delay characteristic of an LFO effect for each module is stored. This data corresponding to the present note ON start module (1st note ON module), which exists at the absolute address IX+LPDPT, is called delay depth data (IX+LPDPT). In S2707, a value obtained by converting the delay counter value (IX+LPDCNT) corresponding to the note ON start module using a given function f is subtracted from the delay depth data (IX+LPDPT), thus acquiring an envelope value determining an oscillation width of the delayed LFO effect corresponding to the module. The envelope value is set in the register A. As is evident from the waveforms in FIGS. 22A and 22B which are associated with the 1st note ON, the envelope value is at the minimum value 0 at the 1st note ON, then gradually increases to the same constant value as the delay depth data (IX+LPDPT) at the end of the delay the final level is the oscillation width (amplitude) of the LFO vibrato for a constant portion. In this case, since the delay counter value (IX+LPDCNT) decreases with time in S2805 in FIG. 28 (which will be described later), the function f should have such a characteristic that with respect to the delay counter value (IX+LPDCNT) as an input, a function value as an output equals the delay depth data (IX+LPDPT) at the initial state, then gently decreases to 0.

The envelope value in the register A computed in S2707 is multiplied by the LFO waveform data set in the register B and to impart an envelope having a delay characteristic and the resultant value is set in the register C in S2708.

In the subsequent step S2709, the value of the register C is subjected to addition/subtraction with bender data set in advance in the register D and the resultant data is set in the register E. The bender data is control data computed in the above-described S1804 or S1806 in FIG. 18 based on the MIDI command or the operation of the controller 17 (see FIG. 1).

The LFO vibrato data produced by the above process is sent to the tone generator 9 in S2710. As a result, the pitch of a musical tone for the 1st note ON module is changed and the LFO vibrato effect is imparted thereto in the tone generator 9.

Figure 28:
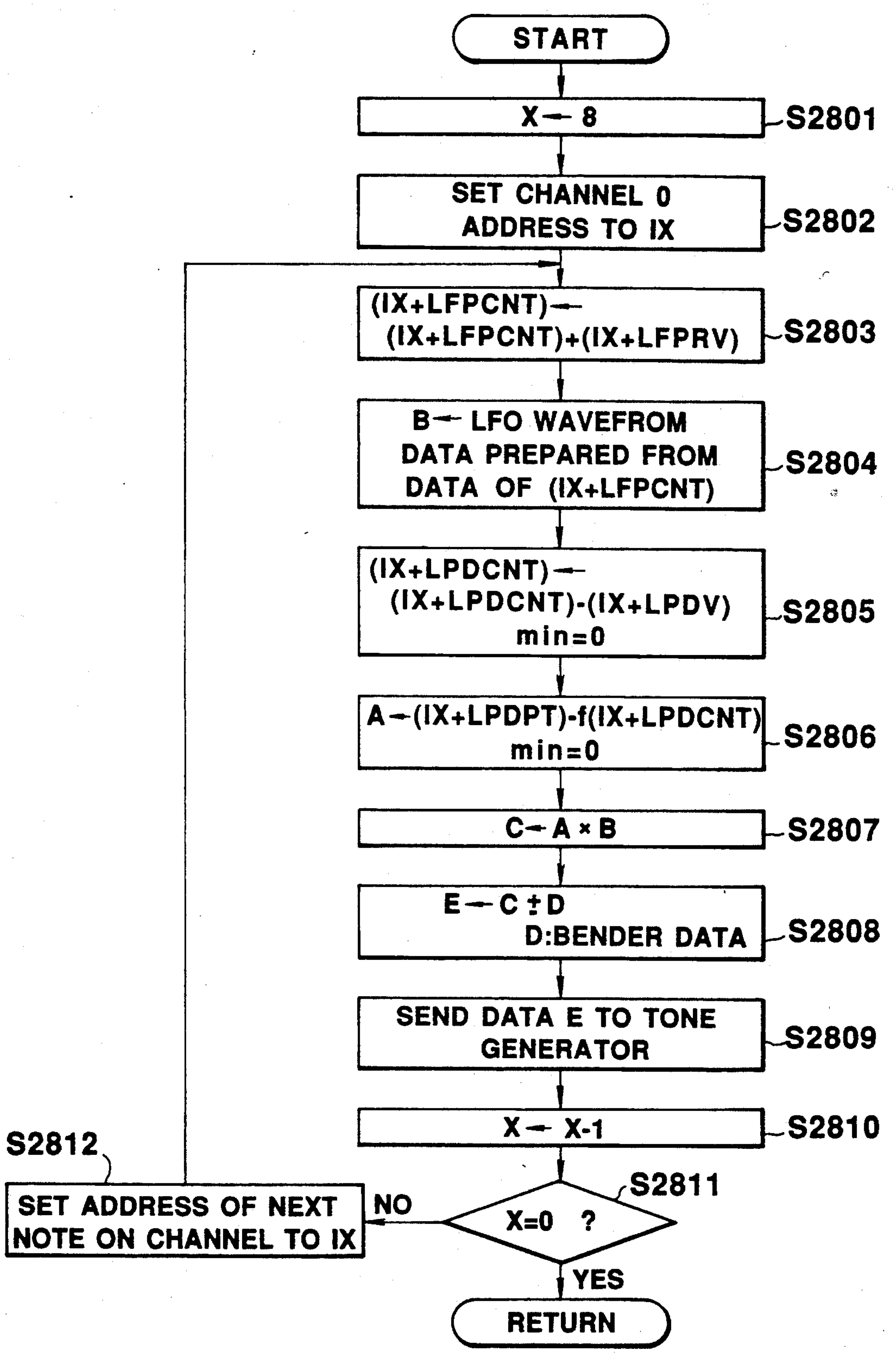
FIG. 28 is an operational flowchart for a timer interrupt LFO vibrato process.

As described above, after the 1st note ON operation is executed, the LFO vibrato process in FIG. 28 corresponding to S1807 is executed every time the control data change process (FIG. 18) is periodically initiated by the timer interruption, and the LFO vibrato effect is imparted at the aforementioned constant period in the tone pitch change process of S1808. The following is a description relating to FIG. 28.

As described above, the processes of S2803 to S2809 are executed for each of the eight modules of the tone generator 9 (FIG. 1) in accordance with the repetitive control process of S2801, S2802, S2810 and S2811, so that the process concerning the 1st note ON musical tone is also executed once as one process of the repetitive operation.

At a relative address LFPRV in the RAM 8 (FIG. 1) of the work area corresponding to each module, data for updating the LFO counter value (IX+LFPCNT) is stored. This data corresponding to the present note ON start module (1st note ON module) exists at the absolute address IX+LFPRV. This data is called LFO update data (IX+LFPRV). In S2803, the LFO update data (IX+LFPRV) is imparted to the LFO counter value (IX+LFPCNT) to be new LFO counter value (IX+LFPCNT), thus updating the counter value.

In S2804, as in S2706 in FIG. 27, LFO waveform data of the note ON start module is prepared from the LFO counter value (IX+LFPCNT) and is set in the register B.

Subsequently, at a relative address LPDV in the RAM 8 (FIG. 1) of a work area corresponding to each module, data for updating the delay counter value (IX+LPDCNT) is stored. The data corresponding to the present note ON start module (1st note ON module) exists at the absolute address IX+LPDV. This data is called delay update data (IX+LPDV). In S2805, the delay update data (IX+LPDV) is subtracted from the delay counter value (IX+LPDCNT) corresponding to the 1st note ON module to be new delay counter value (IX+LPDCNT), thus updating this counter value. The minimum value of the counter value is controlled not to be smaller than 0.

In S2806, as in S2707 in FIG. 27, an envelope value determining the amplitude of the delay characteristic of the LFO effect corresponding to the 1st note ON is computed by subtracting, from the delay depth data (IX+LPDPT), a value obtained by converting the delay counter value (IX+LPDCNT) corresponding to the 1st note ON using a given function f, and the resultant value is set in the register A.

The same processes of S2708 to S2710 in FIG. 27 are executed in S2807 to S2809, and the resultant LFO vibrato data is sent to the tone generator 9. In the tone pitch change process of S1808 in FIG. 18, the pitch of a musical tone for the 1st note ON module of the tone generator 9 is changed and the LFO vibrato effect is imparted to the musical tone. Pitch alteration is sequentially executed in the tone generator 9 by repeating such a process at a given period, and the LFO vibrato effect as shown in FIG. 22A or 22B is imparted to the 1st note ON musical tone.

Since the operation of FIG. 28 needs to be executed for a note ON tone generator module, i.e., a tone generator module which is generating a tone signal currently, it is possible to judge the status of each tone generator module and execute the sequence of processes S2803 to S2809 only for the necessary tone generator modules in order to shorten the actual processing time.

A description will now be given of the case (2) where a play mode other than the combination mode is selected and note ON of the second musical tone, third musical tone and so forth (2nd note ON, 3rd note ON, . . . ) has occurred following the 1st note ON. In this case, different operations will be performed depending on whether or not the guitar mode is selected. To begin with, a description will be given of a case where the guitar mode is selected for the 2nd note ON, 3rd note ON, and so forth.

In this case, after the decision in S2601 in FIG. 26 becomes NO, the head addresses of the work areas in the RAM 8 corresponding to the note ON start modules (modules at the time of 2nd note ON, 3rd note ON, etc.) are set as IX in S2602. Then, the flow advances to the process shown in FIG. 27 from S2603. After the decision in S2701 becomes NO, the decision in S2704 becomes YES and the flow advances to S2703. In S2703, an LFO counter value (IX+LFPCNT) independently corresponding to a module which has started its tone generation is initialized and initial data is set as a delay counter value (IX+LPDCNT). Therefore, the LFO waveform data produced in S2706 and the envelope value produced in S2707 are prepared on the basis of the LFO counter value (IX+LFPCNT) and the delay counter value (IX+LPDCNT) independently associated with each note ON start module such as the 2nd note ON, rd note ON or the like. The LFO vibrato characteristic, particularly, the delay characteristic, which is started to be imparted to each note ON start module of the tone generator 9 in the subsequent processes of S2708 to S2710, is such that the oscillation width or the amplitude gradually increases from 0, as shown in FIG. 22B, independently for each of 1st note ON, 2nd note ON, 3rd note ON and so forth.

Further, in the LFO vibrato process executed at a constant period in S1807 in the control data change process shown in FIG. 18, the processes of S2803 to S2809 are repeated for each of the eight modules of the tone generator 9.

In this case, for each repetition, the head address IX of the work area corresponding to each module is set in S2812, the LFO counter value (IX+LFPCNT) is updated independently for each module in S2803, independent LFO waveform data is produced in S2804 and the delay counter value (IX+LPDCNT) is independently updated for each module. Based on the above updating, envelope values independently corresponding to the 1st note ON, 2nd note ON, 3rd note ON and so forth are prepared in S2806.

Accordingly, the LFO vibrato data to be sent to the individual note ON modules of the tone generator 9 become quite independent for the respective modules through the subsequent processes S2807 to S2809, and the LFO vibrato characteristic, particularly, the delay characteristic, imparted to each note ON module in the tone pitch change process of S1808 in FIG. 18 becomes 3rd note ON and so forth, as shown in FIG. 22B. For the sake of convenience, FIG. 22B illustrates a case where the LFO update data (IX+LFPRV) is set common to the individual modules. Varying the value of this data varies the change rate (phase change) of the LFO counter value (IX+LFPCNT) for the individual modules.

A description will now be given of the case where the guitar mode is not selected for the 2nd note ON, 3rd note ON, and so forth in a play mode other than the combination mode. That is, a description will be given of the case (3).

In this case, the flow advances from S2601 to S2602, then to S2603 in FIG. 26. After the decision in S2701 in FIG. 27 becomes NO, the decision in S2704 becomes NO and the flow advances to S2705.

In S2705, a counter value corresponding to the module which has already rendered to be 1st note ON, is set as a delay counter value (IX+LPDCNT) after the LFO counter value (IX+LFPCNT) corresponding to that module which has started tone generation is initialized. Although this counter value is stored in the relative address LPDCNT of the work area in the RAM 8 corresponding to the 1st note ON module, the head address of the work area for the 1st note ON is stored at the FSTLFO in the RAM 8 in the above-described process of S2702. Therefore, the counter value can be attained by loading, as the delay counter value (IX+LPDCNT), a value stored at the absolute address attained by imparting the relative address value LPDCNT to the address value stored at the address FSTLFO. In the following operation, therefore, this process permits the delay counter value (IX+LPDCNT) corresponding to each note ON start module for the 2nd note ON, 3rd note ON, etc., to work in synchronism with the one involved at the time of the 1st note ON.

Therefore, the envelope values produced in S2707, which correspond to the individual note ON start modules for the 2nd note ON, 3rd note ON, etc., all become coincident with the one corresponding to the note ON start module for the 1st note ON.

Consequently, the LFO vibrato characteristic, particularly, the delay characteristic, which is started to be imparted to each note ON start module of the tone generator 9 in the subsequent processes of S2708–S2710, is such that the oscillation widths or the amplitudes for the 2nd note ON, 3rd note ON and so forth are all increased from the amplitude synchronized with that of the 1st note ON, as shown in FIG. 22A.

Further, in the LFO vibrato process executed at a constant period in S1807 in the control data change process shown in FIG. 18, even when the processes of S2804 to S2809 are repeated for the individual eight modules of the tone generator 9, the delay counter value (IX+LPDCNT) for each module is updated in synchronism with that of the 1st note ON module in S2805. Therefore, the LFO vibrato data to be sent to the individual note ON modules of the tone generator 9 will have the same delay characteristic as that of the 1st note ON module in the processes of S2806 to S2809, and the LFO vibrato characteristic, particularly, the delay characteristic, imparted to the individual note ON modules in the subsequent tone pitch change process of S1808 (FIG. 18) is such that the 2nd note ON, 3rd note ON and so forth are all synchronized with the 1st note ON, as shown in FIG. 22A. For the sake of convenience, FIG. 22A illustrates a case where the LFO update data (IX+LFPRV) and delay update data (IX+LPDV) are set common to the individual modules. Varying the values of these data varies the change rates (phase changes) of the LFO counter value (IX+LFPCNT) and delay counter value (IX+LPDCNT) for the individual modules.

As described above, according to this embodiment, even in different cases where the guitar mode is selected and where it is not selected, the LFO vibrato (delay vibrato) effect can be imparted in such a way that the optimal vibrato effect is given to a tone waveform in either mode.

A description will now be given of the case the combination mode is selected. In this case, in generating two timbres simultaneously, setting on the total ON key 22 (FIG. 23) sets the total ON mode in which the LFO vibrato effect is synchronously imparted to the simultaneously-generated two timbres. This feature allows a natural LFO vibrato effect to be given to the simultaneously-generated two timbres. In a case where an operation other than the simultaneous generation of two timbres is performed, setting off the total ON key 22 sets the total OFF mode in which the LFO vibrato effect can be imparted independently to individual musical tones. Further, in either the total ON mode or total OFF mode, different operations for imparting delay characteristic of the LFO vibrato can be performed in different cases where the guitar mode is selected and it is not selected.

To begin with, the case of the total OFF mode (case (4)) will be described below.

As the combination mode is set, the decision in S2601 in FIG. 26 becomes YES and the flow advances to S2604. In this step, upon each input of a note ON command, the number of note ON modules of the tone generator 9 which simultaneously perform tone generation is set to the variable X in the RAM 8. In the case of the simultaneous generation of two timbres as illustrated in FIG. 6, x=2 is set. In addition, two or more notes (chord) having a predetermined pitch relation may be simultaneously generated, in which case the value to be set would be the number of note ON modules required for this process.

In total OFF mode, the decision in S2606 becomes NO, so that the process of S2607 is not executed. As a result, the process of assigning modules for simultaneous tone generation to the tone generator 9 and setting the head address IX of the work area corresponding to the note ON start module in the RAM 8 (the above being the process of S2605) and the note ON attack process (note ON start process; S2608) are executed by performing the repetitive control process of S2609 and S2610.

The process of S2608 is the same as that of S2603 and the same LFO vibrato process as illustrated in FIG. 27 is therefore executed.

Accordingly, upon each repetition of S2609 and S2610 in FIG. 26, the LFO vibrato process for an attack portion in FIG. 27 and the timer-interrupt-invoked LFO vibrato process in FIG. 28 (which have already been described) are executed for the individual modules which simultaneously start tone generation. In this case, since the delay depth data (IX+LPDPT), LFO update data (IX+LFPRV) and delay update data (IX+LPDV) are quite independently set and controlled between the individual modules simultaneously starting tone generation, the LFO vibrato effect to be imparted to musical tones whose generations have simultaneously started based on these data is completely independent between these musical tones. As described above, one case for setting the total OFF mode may be such that if two or more notes (chord) are to be simultaneously generated, a player may want to independently impart the LFO vibrato effect to the constituting notes of chord. In this case too, as in the case where the combination mode is not selected, it is possible to select whether or not the delay characteristic should be synchronized with the 1st note ON depending on whether or not the guitar mode is selected.

The case of the total ON mode (case (5)) will now be described.

As the combination mode is set, the decision in S2601 in FIG. 26 becomes YES and the flow advances to S2604. In this step, as in the previous case of the total OFF mode, upon each input of a note ON command, the number of note ON modules of the tone generator 9 which simultaneously perform tone generation is set to the variable X in the RAM 8 shown in FIG. 1.

In total ON mode, the decision in S2606 becomes YES, the process of assigning modules for simultaneous tone generation to the tone generator 9 and setting the head address IX of the work area corresponding to the note ON start module in the RAM 8 (the above being the process of S2605), the process of S2607 and the note ON attack process (note ON start process; S2608) are executed by performing the repetitive control process of S2609 and S2610.

In S2607, common data is set as the delay depth data (IX+LPDPT), LFO update data (IX+LFPRV) and delay update data (IX+LPDV) for the individual modules which simultaneously start tone generation. It should be noted that these items of data are stored in a predetermined area in the RAM 8 (FIG. 1).

After executing the above process, the LFO vibrato process for an attack portion in FIG. 27 and the timer-interrupt-invoked LFO vibrato process in FIG. 28 (which have already been described) are executed for the individual modules which simultaneously start tone generation. Accordingly, the LFO vibrato effect to be imparted to musical tones whose generations have simultaneously started based on these data is completely synchronized between these musical tones. As described above, one case for setting the total ON mode may be such that if two timbres are to be simultaneously generated, a player may want to impart the same LFO vibrato effect to each timbre. In this case too, as in the case where the combination mode is not selected, it is possible to select whether or not the delay characteristic should be synchronized with the 1st note ON depending on whether or not the guitar mode is selected.

As described above, even in different cases where the total ON mode is selected in combination mode, the total OFF mode is selected in the same mode, the guitar mode is selected and where it is not selected, the LFO vibrato (delay vibrato) effect can be imparted in such a way that the optimal vibrato effect is given to a tone waveform in either mode.

The above embodiment can permit selection of whether or not to impart the delay characteristic independently for the individual note ON times in the delay LFO vibrato process depending on whether the total ON mode or total OFF mode is set or the guitar mode is selected or not. The same may be applied to the LFO tremolo (growl) process or the like in the control data change process shown in FIG. 18.

Although the above embodiment permits common data to be set as the delay depth data (IX+LPDPT), LFO update data (IX+LFPRV) and delay update data (IX+LPDV) used for controlling the LFO vibrato only between the individual modules which simultaneously start tone generation when the total ON mode is selected, these data may be commonly used between the 1st note ON, 2nd note ON, 3rd note ON and so forth. Whether or not common data for the 1st note ON time is set as the initial value of the delay counter value (IX+LPDCNT) is determined depending on whether or not the guitar mode is selected, as already described.

With the above arrangement, in a case a plurality of tone signals having different timbres are simultaneously generated for each note ON start command, a common low frequency modulation effect or LFO effect is imparted to these simultaneously generated timbres, thus ensuring imparting of a natural LFO effect.

Further, in a case where musical tones can be generated in a tone generation mode different from the above-described tone generation mode, when a musical tone is to be generated in this different mode, the low frequency modulation is switched to the one matching this mode so that tone generation control can be performed as to give the proper LFO effect for each tone generation mode.

Further, in a case where the tone generating means can generate musical tones in each tone generation mode associated with, for example, an electronic guitar and other types of electronic musical instruments in accordance with the aforementioned low frequency modulation imparting control, when a tone generation mode for performing tone generation control based on the musical operation of the electronic guitar is selected, for example, an LFO effect having a delay characteristic is imparted in such a manner that the width of the oscillation or the amplitude of the same effect gradually increases from zero in a given time independently from the note ON start time for each tone signal and becomes a given amplitude thereafter. This feature can permit a control to impart an LFO effect accompanied by the optimal delay characteristic to musical tones without impairing the musical expression of each string of the electronic guitar or the like.

When a tone generation mode for executing tone generation control based on a musical operation other than that of an electronic guitar is selected, for example, an LFO effect having a delay characteristic is imparted in such a manner that the width of the oscillation of the same effect gradually increases from zero in a given time from the note ON start time for the tone signal which has the 1st note ON from a note OFF state and becomes a given amplitude thereafter, and an effect synchronized with the LFO vibrato or the like imparted to this 1st note ON tone signal is imparted to those tone signals whose generation follows that of the 1st note ON tone signal. This feature can ensure a control to impart an LFO effect accompanied by the proper delay characteristic for an electronic musical instrument other than, for example, an electronic guitar.

As explained in the foregoing description of preferred embodiments of the present invention, this invention can realize an electronic musical instrument which can perform tone generation in a tone generation mode most suitable for the musical operation mode based on which input music play data is produced.

Accordingly, even if the polyphonic number is about eight, when a keyboard instrument, an electronic guitar, an electronic wind instrument, a sequencer or the like is coupled as an external unit, it is possible to execute the optimal tone generation control for music play data based on the musical operation of each unit. This can provide multifarious musical expressions and can permit a single tone generator module to be coupled to many types of electronic musical instruments.

Further, the present invention can realize such a control as to impart the optimal LFO effect to musical tones according to each of a tone generation mode for simultaneously generating musical tones with a plurality of timbres in response to a note ON start command, a tone generation mode other than the former one and individual tone generation modes for an electronic guitar and other types of electronic musical instruments.

This invention may be practiced or embodied in still other ways without departing from the spirit or essential characteristic thereof. The preferred embodiments described in the foregoing description are therefore illustrative and not restrictive, the scope of the invention being indicated by the appended claims an all variations which come within the meaning of the claims are intended to be embraced therein.

What is claimed is:

1. An electronic musical instrument supplied with a music play data via MIDI channels, comprising:

tone generating means having a plurality of tone generating modules each generating a tone signal based on given music play data;

tone generation mode selecting means for selecting an arbitrary one of a plurality of tone generation modes corresponding to a plurality of musical operation modes including a keyboard instrument play mode and a stringed instrument play mode; and control means for permitting said tone generating means to generate a tone signal corresponding to input music play data in accordance with a tone generation mode selected by said tone generation mode selecting means;

said control means, when said keyboard instrument play mode is specified by said tone generating mode selecting means, assigning one MIDI channel commonly to said plurality of tone generating modules of said tone generating means to thereby control generation of a tone signal for said keyboard instrument play mode, and when said stringed instrument play mode is specified by said tone generation mode, assigning respective MIDI channels to said plurality of tone generating modules of said tone generating means for each string, to thereby control generation of a tone signal independently for said music play data input for individual MIDI channels.

2. An electronic musical instrument supplied with a music play data via MIDI channels, comprising:

tone generating means having a plurality of tone generating modules each generating a tone signal based on given music play data;

tone generation mode selecting means for selecting an arbitrary one of a plurality of tone generation modes corresponding to a plurality of musical operation modes including a wind instrument play mode and a stringed instrument play mode; and control means for permitting said tone generating means to generate a tone signal corresponding to input music play data in accordance with a tone generation mode selected by said tone generation mode selecting means;

said control means, when said wind instrument play mode is specified by said tone generating mode selecting means, assigning one MIDI channel commonly to said plurality of tone generating modules of said tone generating means to thereby control generation of a tone signal for said wind instrument play mode, and when said stringed instrument play mode is specified by said tone generation mode, assigning respective MIDI channels to said plurality of tone generating modules of said tone generating means for each string, to thereby control generation of a tone signal independently for said music play data input for individual MIDI channels.

3. An electronic musical instrument comprising:

tone generating means for generating a tone signal based on given music play data including a tone generation start command;

tone generation mode selecting means for selecting an arbitrary one of a plurality of tone generation modes corresponding to a plurality of musical operation modes;

control means for permitting said tone generating means to generate a tone signal corresponding to input music play data in accordance with a tone generation mode selected by said tone generation mode selecting means;

said control means performing a control operation to change a modulation effect state to be imparted to a tone signal whose generation from said tone generating means starts based on said music plate data in accordance with a tone generation mode selected by said tone generation mode selecting means; and said tone generating means including:

first modulation imparting means for imparting a low frequency modulation to a tone signal whose generation starts for each tone generation start command in such a manner that a modulation degree of said low frequency modulation gradually increases from a tone generation start time and reaches a given degree after a predetermined time; and second modulation imparting means for imparting a low frequency modulation according to which a modulation degree gradually increases from said tone generation start time and reaches a give degree after a predetermined time, to a first tone signal to be generated based on a first tone generation start command from a state in which all tone signals are rendered off, and for imparting a low frequency modulation to those tone signals to be generated in response to tone generation start commands following said first tone generation start command in synchronism with said low frequency modulation imparted to said first tone signal being generated; and said control means including selecting means for selectively driving said first modulation imparting means and said second modulation imparting means in accordance with a tone generation mode specified by said tone generation mode selecting means.

4. An electronic musical instrument according to claim 3, wherein:

said tone generation mode selecting means includes means for selecting an arbitrary one of the plurality of tone generation modes including a stringed instrument play mode and a keyboard instrument play mode; and said selecting means drives said first modulation imparting means when said stringed instrument play mode is selected by said tone generation mode selecting means, and drives said second modulation imparting means when said keyboard instrument play mode is selected by said tone generation mode selecting means.

5. An electronic musical instrument comprising:

tone generating means having a plurality of tone generating modules each generating a tone signal based on given music play data including pitch bend data;

tone generation mode selecting means for selecting an arbitrary one of a plurality of tone generation modes corresponding to a plurality of musical operation modes including a keyboard instrument play mode and a stringed instrument play mode; and control means for permitting said tone generating means to generate a tone signal corresponding to input music play data in accordance with a tone generation mode selected by said tone generation mode selecting means;

said control means, when said keyboard instrument play mode is selected to specify a tone generation mode for said tone generating means by said tone generation mode selecting means, performing a control operation so as to give a pitch bend effect commonly to said plurality of tone generation modules of said tone generating means in accordance with said pitch bend data, and when said stringed instrument play mode is selected to specify a tone generation mode for said tone generating means by said tone generation mode selecting means, performing a control operation so as to give a pitch bend effect only to that tone generating module which is associated in advance with a string that has produced said pitch bend data.

6. An electronic musical instrument capable of generating musical tones by selecting an arbitrary one of a plurality of tone generation modes corresponding to a plurality of musical operation modes, said instrument comprising:

tone generating means for independently generating a plurality of tone signals in accordance with note ON commands;

first modulation imparting means for imparting a low frequency modulation to each independent tone signal generated according to each note ON command in such a manner that a modulation degree gradually increases starting from a note ON start time and reaches a given degree after a predetermined time for each independent tone signal generated;

second modulation imparting means for imparting a low frequency modulation to a first tone signal generated according to first note ON command from a state in which all tone signals are rendered off in such a manner that a modulation degree gradually increases starting from said ON start time and reaches a given modulation degree after a predetermined time, and for imparting a low frequency modulation to each subsequent tone signal generated according to each subsequent note ON command in such a manner that said low frequency modulation imparted to each subsequent tone signal is immediately in synchronism with said low frequency modulation imparted to said first tone signal at the time each subsequent tone signal is generated; and selecting means for selectively driving one of said first and second modulation imparting means in accordance with a tone generation mode selected in association with a musical operation mode.

7. An electronic musical instrument comprising:

tone generating means having a simultaneous tone generation mode for simultaneously generating a plurality of tone signals having different timbres for respective note ON start commands, said tone generating means being able to select an arbitrary one of a plurality of tone generation modes corresponding to a plurality of musical operation modes to independently generate a plurality of tone signals;

first modulation imparting means for imparting a common low frequency modulation to a plurality of tone signals having different timbres to be simultaneously generated by said tone generating means for each note ON start command;

second modulation imparting means for imparting to a musical tone generated in a tone generation mode different from said simultaneous tone generation mode, a low frequency modulation according to said tone generation mode;

first selecting means for selectively driving one of said first and second modulation imparting means depending on whether said tone generation mode in said tone generating means is said simultaneous tone generation mode or said tone generation mode different therefrom;

third modulation imparting means for imparting a low frequency modulation to a tone signal for each note ON start command in such a manner that a modulation degree gradually increases starting from a note ON start time thereof and reaches a given modulation degree after a predetermined time;

fourth modulation imparting means for imparting a low frequency modulation according to which a modulation degree gradually increases starting from said note ON start time and reaches a given modulation degree after a predetermined time, to a first one of tone signals to be generated based on a first note ON start command from a state in which all tone signals are rendered off in said tone generating means, and for imparting a low frequency modulation to those tone signals to be generated in response to note ON start commands following said first one in synchronism with said low frequency modulation imparted to said first tone signal generated; and second selecting means for selectively driving one of said third and fourth modulation imparting means in accordance with a tone generation mode selected in association with a musical operation mode.

* * * * *